US009929368B2

(12) United States Patent
Kataishi et al.

(10) Patent No.: US 9,929,368 B2
(45) Date of Patent: Mar. 27, 2018

(54) LIGHT-EMITTING ELEMENT, LIGHTING DEVICE, AND ELECTRONIC APPLIANCE

(71) Applicant: SEMICONDUCTOR ENERGY LABORATORY CO., LTD., Atsugi-shi, Kanagawa-ken (JP)

(72) Inventors: Riho Kataishi, Kanagawa (JP); Toshiki Sasaki, Kanagawa (JP); Yusuke Nonaka, Kanagawa (JP); Hiromi Seo, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/116,313

(22) PCT Filed: Jan. 28, 2015

(86) PCT No.: PCT/IB2015/050633
§ 371 (c)(1),
(2) Date: Aug. 3, 2016

(87) PCT Pub. No.: WO2015/118426
PCT Pub. Date: Aug. 13, 2015

(65) Prior Publication Data
US 2017/0012232 A1 Jan. 12, 2017

(30) Foreign Application Priority Data
Feb. 6, 2014 (JP) .................. 2014-021444

(51) Int. Cl.
*H01L 29/10* (2006.01)
*H01L 29/12* (2006.01)
(Continued)

(52) U.S. Cl.
CPC .......... *H01L 51/5092* (2013.01); *C09K 11/06* (2013.01); *G06F 3/041* (2013.01);
(Continued)

(58) Field of Classification Search
CPC ............. H01L 51/5092; H01L 51/5206; H01L 27/323; H01L 27/3262; H01L 51/5072;
(Continued)

(56) References Cited

U.S. PATENT DOCUMENTS 7,560,862 B2  7/2009  Liao et al.
7,663,140 B2  2/2010  Yamazaki et al.
(Continued)

FOREIGN PATENT DOCUMENTS

CN   001866574 A   11/2006
CN   101752512 A    6/2010
(Continued)

OTHER PUBLICATIONS

Fukagawa.H et al., "Highly Efficient Inverted OLED with Air-Stable Electron Injection Layer", SID Digest '13 : SID International Symposium Digest of Technical Papers, May 21, 2013, pp. 1466-1469.
(Continued)

*Primary Examiner* — Victor A Mandala
(74) *Attorney, Agent, or Firm* — Nixon Peabody LLP; Jeffrey L. Costellia

(57) ABSTRACT

A tandem light-emitting element employing an inverted-structure is provided. The light-emitting element includes a cathode, a first EL layer over the cathode, a second EL layer over the first EL layer, an anode over the second EL layer, and an intermediate layer. The intermediate layer is between the first EL layer and the second EL layer. The intermediate layer includes a first layer, a second layer over the first layer, and a third layer over the second layer. The first layer includes a hole-transport material and an electron acceptor. The third layer includes an alkali metal or an alkaline earth metal. The second layer includes an electron-transport material.

44 Claims, 17 Drawing Sheets

(51) Int. Cl.
| | |
|---|---|
| *H01L 51/50* | (2006.01) |
| *C09K 11/06* | (2006.01) |
| *H05B 33/14* | (2006.01) |
| *G06F 3/041* | (2006.01) |
| *H01L 51/00* | (2006.01) |
| *H01L 51/52* | (2006.01) |
| *H01L 27/32* | (2006.01) |
| *F21Y 115/10* | (2016.01) |
| *F21V 33/00* | (2006.01) |
| *F21W 131/301* | (2006.01) |

(52) U.S. Cl.
CPC .......... *H01L 27/322* (2013.01); *H01L 27/323* (2013.01); *H01L 27/3262* (2013.01); *H01L 51/5072* (2013.01); *H01L 51/5206* (2013.01); *H01L 51/5278* (2013.01); *H05B 33/14* (2013.01); *H05B 33/145* (2013.01); *C09K 2211/1007* (2013.01); *C09K 2211/1044* (2013.01); *C09K 2211/185* (2013.01); *F21V 33/0012* (2013.01); *F21W 2131/301* (2013.01); *F21Y 2115/10* (2016.08); *H01L 27/3209* (2013.01); *H01L 27/3244* (2013.01); *H01L 51/006* (2013.01); *H01L 51/0081* (2013.01); *H01L 51/0085* (2013.01); *H01L 51/524* (2013.01); *H01L 51/5246* (2013.01); *H01L 51/5259* (2013.01); *H01L 51/5268* (2013.01); *H01L 2251/5353* (2013.01); *H01L 2251/5361* (2013.01)

(58) Field of Classification Search
CPC ............... H01L 27/322; H01L 51/5278; H01L 51/5246; H01L 27/3209; H01L 2251/5353; H01L 51/5268; H01L 51/5259; H01L 27/3244; H01L 51/524; H01L 2251/5361; H01L 51/0085; H01L 51/0081; H01L 51/006; C09K 2211/185; C09K 2211/1044; C09K 2211/1007; C09K 11/06; G06F 3/041; H05B 33/14; H05B 33/145; F21Y 2115/10; F21V 33/0012; F21W 2131/301

See application file for complete search history.

(56) References Cited

U.S. PATENT DOCUMENTS

| | | | |
|---|---|---|---|
| 8,076,671 | B2 | 12/2011 | Yamazaki et al. |
| 8,536,569 | B2 | 9/2013 | Yamazaki et al. |
| 2006/0087225 | A1 | 4/2006 | Liao et al. |
| 2006/0263629 | A1* | 11/2006 | Aziz .................. H01L 27/3209 428/690 |
| 2008/0135858 | A1 | 6/2008 | Yamazaki et al. |
| 2010/0140607 | A1 | 6/2010 | Yamazaki et al. |
| 2012/0095226 | A1* | 4/2012 | Inoue ................. C07F 15/0033 544/225 |
| 2012/0104373 | A1* | 5/2012 | Inoue ................. C07F 15/0033 257/40 |
| 2012/0193613 | A1* | 8/2012 | Kadoma ............. C07D 409/10 257/40 |
| 2012/0205684 | A1 | 8/2012 | Yamazaki et al. |
| 2012/0205686 | A1 | 8/2012 | Seo et al. |
| 2012/0228588 | A1 | 9/2012 | Mitsuya |
| 2012/0235166 | A1* | 9/2012 | Nowatari ........... H01L 51/5016 257/79 |
| 2014/0145168 | A1* | 5/2014 | Ohsawa ............. H01L 51/5016 257/40 |
| 2017/0162798 | A1* | 6/2017 | Osaka ................ H01L 51/0072 |

FOREIGN PATENT DOCUMENTS

| | | |
|---|---|---|
| CN | 102176514 A | 9/2011 |
| CN | 102255051 A | 11/2011 |
| CN | 102637829 A | 8/2012 |
| CN | 102683604 A | 9/2012 |
| CN | 103904229 A | 7/2014 |
| DE | 102006023512 | 1/2007 |
| EP | 2192633 A | 6/2010 |
| EP | 2487719 A | 8/2012 |
| JP | 2003-272867 A | 9/2003 |
| JP | 2006-012793 A | 1/2006 |
| JP | 2006-332048 A | 12/2006 |
| JP | 2008-518400 | 5/2008 |
| JP | 2011-009688 A | 1/2011 |
| JP | 2011-096406 A | 5/2011 |
| JP | 2012-182126 A | 9/2012 |
| JP | 2012-186392 A | 9/2012 |
| KR | 2006-0120505 A | 11/2006 |
| KR | 2010-0062930 A | 6/2010 |
| KR | 2011-0095839 A | 8/2011 |
| KR | 2012-0092518 A | 8/2012 |
| KR | 2015-0005489 A | 1/2015 |
| TW | I329374 | 8/2010 |
| TW | 201038120 | 10/2010 |
| TW | 201208475 | 2/2012 |
| TW | 201241745 | 10/2012 |

OTHER PUBLICATIONS

International Search Report (Application No. PCT/IB2015/050633) Dated Jul. 28, 2015.

Written Opinion (Application No. PCT/IB2015/050633) Dated Jul. 28, 2015.

\* cited by examiner

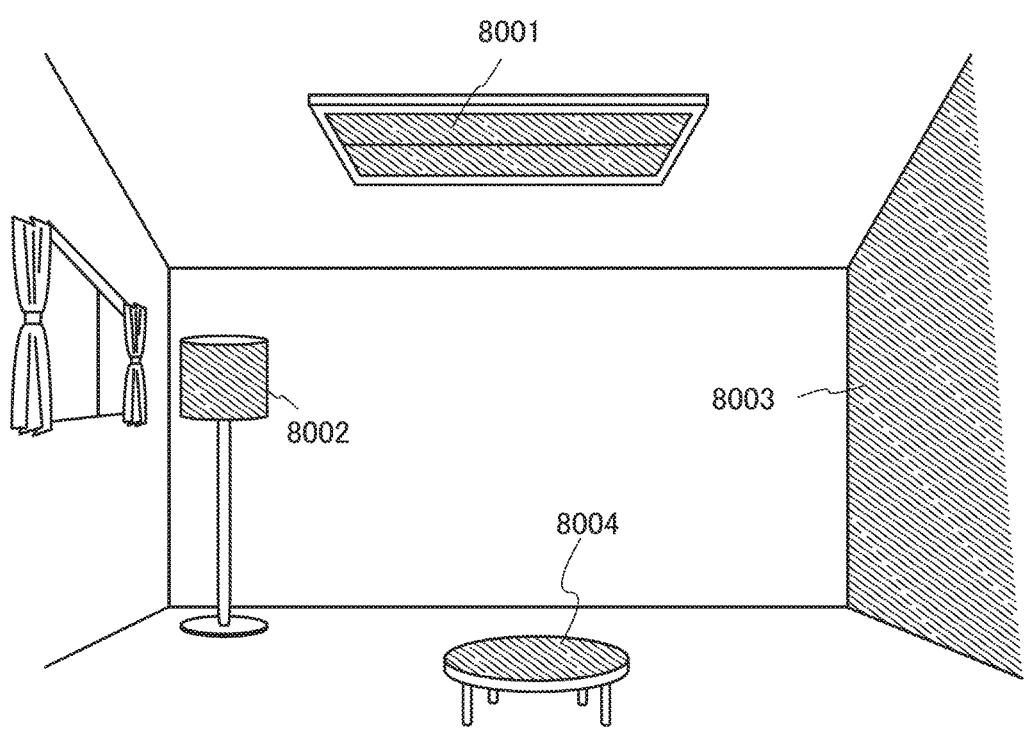

LIGHT-EMITTING ELEMENT, LIGHTING DEVICE, AND ELECTRONIC APPLIANCE

TECHNICAL FIELD

One embodiment of the present invention relates to a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

BACKGROUND ART

Light-emitting elements utilizing electroluminescence have been currently under active research and development. In a basic structure of the light-emitting element utilizing electroluminescence, a layer containing a light-emitting substance (hereinafter, the layer is referred to as a "light-emitting layer") is interposed between a pair of electrodes. By voltage application between the pair of electrodes of the light-emitting element, light can be emitted from the light-emitting substance.

Particularly among light-emitting elements utilizing electroluminescence (EL), the one in which an organic compound is used as the light-emitting substance can be formed by stacking thin films. Because the element can thus be reduced in thickness and weight and can have a larger area easily, it is expected to be used for a planar light source. Furthermore, the light-emitting element is expected to have emission efficiency exceeding that of an incandescent lamp or a fluorescent lamp, and thus has attracted attention as a light-emitting element suitable for lighting equipment.

The light-emitting element can emit light of a variety of colors depending on the kind of light-emitting substance. A light-emitting element which can emit white light or light of color close to white with high efficiency has been particularly required to be applied to lighting.

As a light-emitting element which can emit white light, for example, a white light-emitting element in which a plurality of EL layers having emission peaks in the red, green, and blue wavelength ranges are stacked has been proposed (e.g., Patent Document 1). In addition, a white light-emitting element in which two EL layers having emission peaks in the wavelength ranges of complementary colors (e.g., blue and yellow) are stacked has been proposed (e.g., Patent Document 2). Note that such a structure of stacked EL layers may be called a tandem structure.

A tandem light-emitting element includes, between an anode and a cathode, a plurality of EL layers with an intermediate layer interposed therebetween. Light emitted from the plurality of EL layers can be collectively extracted, and accordingly current efficiency can be made higher than in a light-emitting element including a single EL layer.

The intermediate layer has a structure in which a charge generation layer, an electron-relay layer, an electron-injection buffer layer, and the like are stacked. Note that these layers are not necessarily provided and may be selected as needed.

In manufacture of a tandem light-emitting element, an anode is formed over a substrate, and a hole-injection layer, a hole-transport layer, a light-emitting layer, and an electron-transport layer of a first EL layer are formed over the anode. An intermediate layer is next formed over the electron-transport layer of the first EL layer. When the intermediate layer includes an electron-injection buffer layer, an electron-relay layer, and a charge generation layer, the intermediate layer can be formed by successive evaporation of lithium oxide ($Li_2O$), copper phthalocyanine (abbreviation: CuPc), and a substance having a high hole-transport property, for example. Next, a hole-transport layer, a light-emitting layer, an electron-transport layer, and an electron-injection layer of a second EL layer are formed over the intermediate layer, and a cathode is formed over the second EL layer. Thus, the tandem light-emitting element in which the two EL layers are stacked can be formed.

In the manufacturing process of a light-emitting element, an electrode serving as an anode of the light-emitting element is formed over a substrate before the other electrode serving as a cathode is formed as described above in some cases, and in other cases, an electrode serving as a cathode is formed over a substrate before the other electrode serving as an anode is formed. An element structure formed in the former cases of the manufacturing process is referred to as an "ordered structure", and an element structure formed in the latter cases is referred to as an "inverted structure". Not only these element structures of the light-emitting element are mutually inverted over a substrate, but also the element structures may differ from each other depending on the difference in manufacturing processes. In the tandem structure, the stacking order of the plurality of layers forming the intermediate layer is also inverted (e.g., Patent Document 3).

Furthermore, a structure in which an oxide semiconductor (OS) is used for a semiconductor layer of a field effect transistor (FET) for controlling a light-emitting element has also been proposed. In particular, since an OS-FET using indium gallium zinc oxide (IGZO) as an oxide semiconductor is an n-type transistor in which the majority carriers are electrons, a combination of the OS-FET and the inverted-structure light-emitting element whose cathode is connected to the OS-FET has been proposed as the way to improve element characteristics (e.g., Non-Patent Document 1).

REFERENCES

Patent Documents

[Patent Document 1] Japanese Translation of PCT International Application No. 2008-518400

[Patent Document 2] Japanese Published Patent Application No. 2006-12793

[Patent Document 3] Japanese Published Patent Application No. 2003-272867

[Non-Patent Document] H. Fukagawa, K. Mori, Y. Arimoto and M. Nakajima, SID 2013 DIGEST, p. 1469, 2013

DISCLOSURE OF INVENTION

As described above, the inverted-structure tandem light-emitting element can be expected to have better element characteristics than a conventional one by being combined with the OS-FET. However, in the inverted-structure tandem light-emitting element where the charge generation layer, electron-relay layer, and electron-injection buffer layer of the intermediate layer are stacked in this order over the hole-transport layer or hole-injection layer of the first EL layer, incorporation of metal contained in the electron-injection buffer layer into an already formed layer increases the drive voltage of the light-emitting element and decreases its emission efficiency.

In view of the above problem, an object of one embodiment of the present invention is to provide a novel structure of a light-emitting element. Another object of one embodiment of the present invention is to provide a novel inverted-structure tandem light-emitting element. Another object of one embodiment of the present invention is to provide a novel structure of an intermediate layer in an inverted-structure tandem light-emitting element.

Note that the description of these objects does not disturb the existence of other objects. In one embodiment of the present invention, there is no need to achieve all the objects. Other objects are apparent from and can be derived from the description of the specification, the drawings, the claims, and the like.

One aspect of one embodiment of the invention disclosed in this specification is a light-emitting element including a cathode, a first EL layer over the cathode, a second EL layer over the first EL layer, an anode over the second EL layer, and an intermediate layer. The intermediate layer is between the first EL layer and the second EL layer. The intermediate layer includes a first layer, a second layer over the first layer, and a third layer over the second layer. The first layer includes a hole-transport material and an electron acceptor. The third layer includes an alkali metal or an alkaline earth metal. The second layer includes an electron-transport material.

In the light-emitting element according to one embodiment of the invention disclosed in this specification, the first EL layer can emit first light, the second EL layer can emit second light, and the color of the first light and the color of the second light may be different from each other.

One aspect of another embodiment of the invention disclosed in this specification is a light-emitting element including a cathode, a plurality of EL layers over the cathode, an anode over the plurality of EL layers, and a plurality of intermediate layers. The plurality of intermediate layers are each between two adjacent EL layers. The plurality of intermediate layers each include a first layer, a second layer over the first layer, and a third layer over the second layer. The first layer includes a hole-transport material and an electron acceptor. The third layer includes an alkali metal or an alkaline earth metal. The second layer includes an electron-transport material.

In the light-emitting element according to one embodiment of the invention disclosed in this specification, the second layer may be capable of suppressing diffusion of the alkali metal or the alkaline earth metal into the first layer.

In the light-emitting element according to one embodiment of the invention disclosed in this specification, the third layer may be capable of functioning as an electron-injection buffer layer.

In the light-emitting element according to one embodiment of the invention disclosed in this specification, the cathode may be electrically connected to a field effect transistor, and the field effect transistor may be an n-type field effect transistor. The field effect transistor may include an oxide semiconductor in a semiconductor layer, and the oxide semiconductor may include indium, tin, and gallium.

In the light-emitting element according to one embodiment of the invention disclosed in this specification, the electron-transport material may include bathophenanthroline (Bphen) or tris(8-quinolinolato)aluminum ($Alq_3$). The alkali metal or the alkaline earth metal may be lithium or calcium. The anode may include oxygen, tin, and indium.

Another aspect may be a lighting device including the light-emitting element according to one embodiment of the invention disclosed in this specification. Another aspect may be an electronic appliance including the light-emitting element according to one embodiment of the invention disclosed in this specification and a color filter. Another aspect may be an electronic appliance including the light-emitting element according to one embodiment of the invention disclosed in this specification and a touch panel.

In the inverted-structure tandem light-emitting element, to prevent the alkali metal or alkaline earth metal contained in the material of the electron-injection buffer layer of the intermediate layer from being diffused into the side of the layer on which the electron-injection buffer layer is formed, a layer capable of suppressing movement of the metal is provided between the charge generation layer and the electron-injection buffer layer.

Using, for example, an electron-transport material for the layer capable of suppressing movement of the metal improves the conductivity of the layer even if the metal has reached the layer. Thus, in contrast to an element not including this layer, the inverted-structure tandem light-emitting element can emit light without an increase in its drive voltage.

The electron-relay layer of the intermediate layer is formed using an electron-transport material and provided between the charge generation layer and the electron-injection buffer layer. Hence, the electron-relay layer might have a function of suppressing movement of the metal. However, the function of suppressing movement of the metal and the function of the electron-relay layer are not easy to fulfill at the same time by a layer formed of a single material. The two functions can be performed by a stacked structure of two layers containing two different electron-transport materials. The two-layer stacked structure achieves a light-emitting element with an intermediate layer that moderately ensures an electron-transport property sufficient for the function as a light-emitting element and reduces the problem caused by the movement of the metal.

According to one embodiment of the present invention, a novel structure of a light-emitting element can be provided. According to one embodiment of the present invention, an inverted-structure tandem light-emitting element can be provided. According to one embodiment of the present invention, a novel intermediate layer in an inverted-structure tandem light-emitting element can be provided.

Note that the description of these effects does not disturb the existence of other effects. In one embodiment of the present invention, there is no need to obtain all the above effects. Other effects are apparent from and can be derived from the description of the specification, the drawings, the claims, and the like.

BRIEF DESCRIPTION OF DRAWINGS

In the accompanying drawings.

FIG. 6 illustrates lighting devices.

BEST MODE FOR CARRYING OUT THE INVENTION

Figure 1:
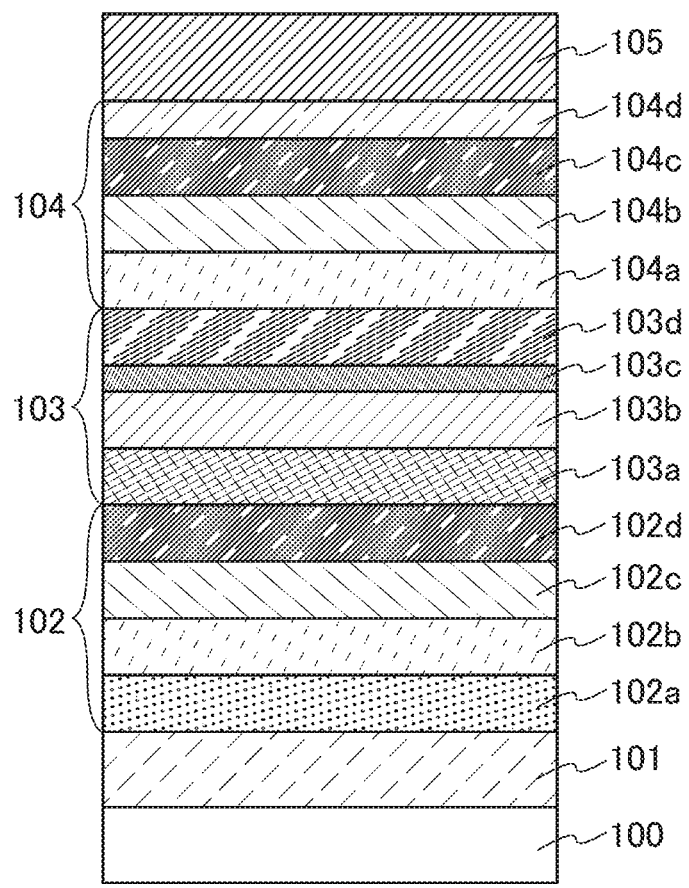
FIG. 1 illustrates a structure of a light-emitting element.

Embodiments of the present invention will be described below in detail with reference to the accompanying drawings. However, the present invention is not limited to the description below, and it is easily understood by those skilled in the art that modes and details disclosed herein can be modified in various ways. Furthermore, the present invention is not construed as being limited to the description of the embodiments and the examples.

Note that in each drawing described in this specification, the size of each component, such as the thickness and the size of an anode, an EL layer, an intermediate layer, a cathode, and the like is exaggerated for clarity in some cases. Therefore, the sizes of the components are not limited to the sizes in the drawings and relative sizes between the components.

Ordinal numbers such as "first", "second", and "third" are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that in the structures of the present invention described in this specification and the like, the same portions or portions having similar functions in different drawings are denoted by the same reference numerals, and description of such portions is not repeated. Furthermore, the same hatching pattern is applied to portions having similar functions, and the portions are not especially denoted by reference numerals in some cases.

In general, color is defined by three aspects of hue (corresponding to the wavelength of light of a single color), chroma (saturation, i.e., the degree to which it differs from white), and value (brightness, i.e., the intensity of light). In this specification, color may be defined by only one of the above three aspects or two of the aspects which are selected arbitrarily. In this specification, a difference between two colors of light means a difference in at least one of the above three aspects and includes a difference in the shapes of two spectra of light or in the distributions of the relative intensity of the peaks in the spectra.

Embodiment 1

In this embodiment, a light-emitting element of one embodiment of the present invention is described with reference to FIG. 1.

FIG. 1 illustrates a light-emitting element including a first EL layer 102, an intermediate layer 103, and a second EL layer 104 between a cathode 101 and an anode 105. Although the number of the EL layers is two in this embodiment, three or more layers may be stacked. The cathode 101 is formed over a substrate 100, the first EL layer 102 is formed over the cathode 101, the intermediate layer 103 is formed over the first EL layer 102, the second EL layer 104 is formed over the intermediate layer, and the anode 105 is formed over the second EL layer 104; thus, the light-emitting element is fabricated. A field effect transistor (FET) may be formed between the substrate 100 and the cathode 101, and a signal supplied from the field effect transistor (FET) is input to the cathode 101.

The cathode 101 is formed over the substrate 100. For the cathode 101, any of a variety of metals, alloys, other conductive materials, and a mixture thereof or the like can be used. For example, a conductive film of metal oxide such as indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide, which has a high work function, can be used. Such metal oxide films can be formed by a sputtering method or a sol-gel method or the like. For example, indium oxide-zinc oxide (indium zinc oxide) can be formed by a sputtering method using a target obtained by adding zinc oxide to indium oxide at 1 wt % to 20 wt %. A film of indium oxide containing tungsten oxide and zinc oxide can be formed by a sputtering method using a target obtained by adding tungsten oxide and zinc oxide at 0.5 wt % to 5 wt % and 0.1 wt % to 1 wt %, respectively, to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, any of the elements belonging to Groups 1 and 2 of the periodic table, which have a low work function, that is, alkali metals such a lithium (Li) and cesium (Cs) and alkaline earth metals such as magnesium (Mg), calcium (Ca), and strontium (Sr); or alloys containing these metals (e.g., an alloy of magnesium and silver or an alloy of aluminum and lithium) can be used. A rare earth metal such as europium (Eu), ytterbium (Yb), or the like, an alloy of any of these metals, or the like can be used. Aluminum (Al), silver (Ag), an alloy containing aluminum (AlSi), or the like can be used. A film of an alkali metal, an alkaline earth metal, or an alloy thereof can be formed by a vacuum evaporation method. A film containing an alloy of an alkali metal or an alkaline earth metal can also be formed by a sputtering method. An electrode of such a material is not limited to a single-layer film and may be a stacked-layer film.

For the cathode 101, a material with a low work function is preferably used in consideration of a carrier injection barrier.

The anode 105 is formed over the stacked layer structure of the EL layers. To function as the anode 105, it is preferably formed using any of metals, alloys, conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, and indium oxide containing tungsten oxide and zinc oxide can be given. Such conductive metal oxide films are usually formed by a sputtering method, but may be formed by application of a sol-gel method or the like. In an example of the formation method, indium oxide-zinc oxide is formed by a sputtering method using a target obtained by adding zinc oxide to indium oxide at 1 wt % to 20 wt %. A film of indium oxide containing tungsten oxide and zinc oxide can be formed by a sputtering method using a target obtained by adding tungsten oxide and zinc oxide at 0.5 wt % to 5 wt %% and 0.1 wt % to 1 wt %, respectively, to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride thereof (e.g., titanium nitride), and the like can be given. Graphene can also be used.

When the anode 105 is formed with a material having a light-transmitting property, the light-emitting element can have a top emission structure. When the anode 105 is formed with a reflective material not having a light-transmitting property and the cathode 101 has a light-transmitting property, the light-emitting element can have a bottom emission structure.

Structures of the light-emitting element and the intermediate layer are next described.

<<Structure of EL Layer>>

The EL layer includes at least a light-emitting layer including a light-emitting substance. In the inverted structure, an electron-injection layer, an electron-transport layer, a light-emitting layer, a hole-transport layer, and a hole-injection layer are formed in this order from the cathode side. Each layer is not necessarily a single layer and may be formed of two or more layers. One layer may serve as the electron-injection layer and as the electron-transport layer, and one layer may serve as the hole-transport layer and the hole-injection layer. One or more layers other than the light-emitting layer may be omitted.

The electron-injection layer is described. The electron-injection layer is first formed on the cathode side of the EL layer. The electron-injection layer is a layer containing a substance having a high electron-injection property. For the electron-injection layer, an alkali metal, an alkaline earth metal, or a compound of the metal such as lithium fluoride (LiF), cesium fluoride (CsF), calcium fluoride ($CaF_2$), or lithium oxide ($LiO_x$) can be used. A rare earth metal compound such as erbium fluoride ($ErF_3$) can be used. Any of the above substances for forming the electron-transport layer can be used.

Alternatively, a composite material in which an organic compound and an electron donor (donor) are mixed may also be used for the electron-injection layer. Such a composite material is excellent in an electron-injection property and an electron-transport property because electrons are generated in the organic compound by the electron donor. In this case, the organic compound is preferably a material that is excellent in transporting the generated electrons. Specifically, for example, the substances forming the electron-transport layer (e.g., a metal complex or a heteroaromatic compound), which are described below, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The electron-transport layer is formed over the electron-injection layer. The electron-transport layer is a layer containing a substance having a high electron-transport property. For the electron-transport layer, a metal complex such as $Alq_3$, $Almq_3$, $BeBq_2$, BAlq, ZnPBO, or ZnBTZ can be used. Furthermore, a heteroaromatic compound such as PBD, OXD-7, TAZ, 3-(4-tert-butylphenyl)-4-(4-ethylphenyl)-5-(4-biphenylyl)-1,2,4-triazole (abbreviation: p-EtTAZ), Bphen, BCP, or 4,4'-bis(5-methylbenzoxazol-2-yl)stilbene (abbreviation: BzOs) can also be used. Furthermore, alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy). The substances mentioned here are mainly ones that have an electron mobility of $10^{-6}$ $cm^2/Vs$ or more. Note that any substance other than the above substances may be used for the electron-transport layer as long as the electron-transport property is higher than the hole-transport property.

Furthermore, the electron-transport layer is not limited to a single layer and may be a stack of two or more layers each containing the aforementioned substance.

Over the electron-transport layer, the light-emitting layer is formed. The light-emitting layer is a layer containing a light-emitting substance. The light-emitting layer may contain only a light-emitting substance; alternatively, a light-emitting substance may be diffused in a host material.

There is no particular limitation on materials that can be used as the light-emitting substance, and light emitted from these substances may be either fluorescence or phosphorescence. Examples of the light-emitting substance are given below.

Examples of the substance emitting phosphorescence include bis {2-[3',5'-bis(trifluoromethyl)phenyl]pyridinato-$N,C^{2'}$}iridium(III) picolinate (abbreviation: $Ir(CF_3ppy)_2$ (pic)), bis[2-(4',6'-difluorophenyl)pyridinato-$N,C^{2'}$]iridium (III) acetylacetonate (abbreviation: FIracac), tris(2-phenylpyridinato)iridium(III) (abbreviation: $Ir(ppy)_3$), bis(2-phenylpyridinato)iridium(III) acetylacetonate (abbreviation: $Ir(ppy)_2(acac)$), tris(acetylacetonato) (monophenanthroline)terbium(III) (abbreviation: $Tb(acac)_3$ (Phen)), bis(benzo[h]quinolinato)iridium(III) acetylacetonate (abbreviation: $Ir(bzq)_2(acac)$), bis(2,4-diphenyl-1,3-oxazolato-$N,C^{2'}$)iridium(III) acetylacetonate (abbreviation: $Ir(dpo)_2(acac)$), bis {2-[4'-(perfluorophenyl)phenyl]pyridinato-$N,C^{2'}$}iridium(III) acetylacetonate (abbreviation: Ir(p-PF-ph)$_2$(acac)), bis(2-phenylbenzothiazolato-$N,C^{2'}$)iridium (III) acetylacetonate (abbreviation: $Ir(bt)_2(acac)$), bis[2-(2'-benzo[4,5-a]thienyl)pyridinato-$N,C^{3'}$]iridium(III) acetylacetonate (abbreviation: $Ir(btp)_2(acac)$), bis(1-phenylisoquinolinato-$N,C^{2'}$)iridium(III) acetylacetonate (abbreviation: $Ir(piq)_2(acac)$), (acetylacetonato)bis[2,3-bis(4-fluorophenyl)quinoxalinato]iridium(III) (abbreviation: Ir(Fdpq)$_2$(acac)), (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: [Ir(tppr)$_2$(dpm)]), (acetylacetonato)bis(6-tert-butyl-4-phenylpyrimidinato)iridium(III) (abbreviation: [Ir(tBuppm)$_2$(acac)]), (acetylacetonato)bis(4,6-diphenylpyrimidinato)iridium(III) (abbreviation: [Ir(dppm)$_2$(acac)]), 2,3,7,8,12,13,17,18-octaethyl-21H,23H-porphyrin platinum(II) (abbreviation: PtOEP), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Although there is no particular limitation on a material that can be used as the host material described above, any of the following substances can be used for the host material, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: Bphen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB, TPD, and BSPB. In addition, condensed polycyclic aromatic compounds such as anthracene derivatives, phenanthrene derivatives, pyrene derivatives, chrysene derivatives, and dibenzo[g,p]chrysene derivatives can be used. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 2PCAPA, 6,12-dimethoxy-5,11-diphenylchrysene, DBC1, CzPA, 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the light-emitting substance described above is preferably selected from these substances and known substances. Moreover, in the case where the light-emitting substance emits phosphorescence, a substance having triplet excitation energy (energy difference between a ground state and a triplet excited state) which is higher than that of the light-emitting substance is preferably selected as the host material.

The light-emitting layer may have a structure in which two or more layers are stacked. For example, in the case where the light-emitting layer is formed by stacking a first light-emitting layer and a light-emitting second layer in that order from the electron-transport layer side, the first light-emitting layer is formed using a substance having an electron-transport property as the host material and the second light-emitting layer is formed using a substance having a hole-transport property as the host material.

Over the light-emitting layer, the hole-transport layer is formed. Examples of the substance having a high hole-transport property used for the hole-transport layer are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, the following carbazole compound can be used: 4,4'-di(N-carbazolyl)biphenyl (abbreviation: CBP), 1,3,5-tris[4-(N-carbazolyl)phenyl]benzene (abbreviation: TCPB), and CzPA. These materials described here mainly are substances having a hole mobility of $10^{-6}$ cm$^2$/(V·s) or more. Note that any substance other than the above substances may be used as long as the hole-transport property is higher than the electron-transport property.

A polymer such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine] (abbreviation: Poly-TPD) can be used.

Over the hole-transport layer, the hole-injection layer is formed. The hole-injection layer is a layer containing a substance having a high hole-injection property. Molybdenum oxide, vanadium oxide, ruthenium oxide, tungsten oxide, manganese oxide, or the like can be used. Alternatively, the hole-injection layer can be formed using a phthalocyanine-based compound such as phthalocyanine (abbreviation: H$_2$Pc) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis {4-[bis(3-methylphenyl)amino]phenyl}-N,N'-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, for the hole-injection layer, a composite material in which a substance having a hole-transport property contains a substance having an acceptor property can be used. Note that the use of such a substance having a hole-transport property which contains a substance having an acceptor property enables selection of a material used to form an electrode regardless of its work function. In other words, besides a material having a high work function, a material having a low work function can be used for the hole-injection layer. As the substance having an acceptor property, 7,7,8,8-tetracyano-2,3,5,6-tetrafluoroquinodimethane (abbreviation: F$_4$-TCNQ), chloranil, or the like can be given. In addition, transition metal oxides can be given. Moreover, an oxide of the metals belonging to Groups 4 to 8 of the periodic table can be given. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, use of a substance having a hole mobility greater than or equal to $10^{-6}$ cm$^2$/(V·s) is preferable. Organic compounds that can be used as the substance having a hole-transport property in the composite material are specifically given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility of $1\times10^{-6}$ cm$^2$/Vs or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as poly(N-vinylcarbazole) (abbreviation: PVK), poly(4-vinyltriphenylamine) (abbreviation: PVTPA), poly[N-((4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

By providing the hole-injection layer, a high hole-injection property can be achieved to allow the light-emitting element to be driven at a low voltage.

As described above, the electron-injection layer, the electron-transport layer, the light-emitting layer, the hole-transport layer, and the hole-injection layer are formed in this order from the cathode side; thus, the EL layer is formed. Note that although the light-emitting layer is indispensable to the EL layer, one or more layers other than the light-emitting layer may be omitted. The materials or thicknesses of the plurality of EL layers formed in the tandem light-emitting element can be the same or different or can be partly the same or different.

<<Structure of Intermediate Layer>>

In the tandem light-emitting element, the intermediate layer is formed between the plurality of EL layers. In the inverted-structure tandem light-emitting element, the charge generation layer, the electron-relay layer, and the electron-injection buffer layer are formed in this order as components of the intermediate layer from the cathode side. The inverted-structure tandem light-emitting element according to one embodiment of the present invention further includes a layer suppressing diffusion of metal contained in a material of the electron-injection buffer layer between the electron-injection buffer layer and the charge generation layer.

The layers in the intermediate layer are each described.

The charge-generation layer contains a substance having a high hole-transport property and a substance having an acceptor property. With the substance having an acceptor property, electrons are extracted from the substance having a high hole-transport property and the extracted electrons are injected through the electron-injection buffer layer into the EL layer that is provided closer to the anode and adjacent to the intermediate layer. The tandem light-emitting element having the charge generation layer can have a long lifetime in a high-luminance region while keeping current density low. In addition, the voltage drop due to resistance of the electrode material can be reduced, whereby uniform light emission in a large area is possible.

The charge generation layer can be formed using the composite material of an organic compound and a metal oxide, a metal oxide, or an appropriate combination thereof. Examples of the composite material of an organic compound and a metal oxide include composite materials of an organic compound and a metal oxide such as vanadium oxide, molybdenum oxide, and tungsten oxide. As the organic compound, any of a variety of organic compounds such as aromatic amine compounds, carbazole derivatives, aromatic hydrocarbons, and high molecular compounds (e.g., oligomers, dendrimers, or polymers) can be used. As the organic compound, it is preferable to use the organic compound which has a hole-transport property and has a hole mobility of $10^{-6}$ cm$^2$/Vs or more. Note that any organic compound other than the above organic compounds may be used as long as the hole-transport property is higher than the electron-transport property. These materials used for the charge generation layer have excellent carrier-injection properties and carrier-transport properties; thus, the light-emitting element can be driven with low current and with low voltage.

The charge generation layer may be formed with a combination of a composite material of an organic compound and a metal oxide with another material. For example, the charge generation layer may be formed by a combination of a layer containing the composite material of an organic compound and a metal oxide with a layer containing one compound selected from electron-donating substances and a compound having a high electron-transport property. Moreover, a layer containing the composite material of an organic compound and a metal oxide may be combined with a transparent conductive film.

The light-emitting element having such a structure is unlikely to have problems such as energy transfer and quenching and has an expanded choice of materials, and thus can easily have both high emission efficiency and a long lifetime. Moreover, it is easy to obtain phosphorescence from one EL layer and fluorescence from the other EL layer. The charge generation layer has a function of injecting holes into one of the EL layers that is in contact with the charge generation layer and injecting electrons into the other EL layer, when voltage is applied between the cathode and the anode.

The electron-relay layer is formed over the charge generation layer. The electron-relay layer is formed with an electron-transport material. Use of a material having a high electron-transport property enables electrons to be rapidly transported from the charge generation layer into the electron-injection buffer layer.

As the substance having an electron-transport property which is contained in the electron-relay layer, a phthalocyanine-based material or a metal complex having a metal-oxygen bond and an aromatic ligand is preferably used.

As the metal complex having a metal-oxygen bond and an aromatic ligand, a metal complex having a metal-oxygen double bond is preferably used. Since the metal-oxygen double bond has an acceptor property (a property of easily accepting electrons), electrons can be transferred (donated and accepted) more easily. Furthermore, the metal complex having a metal-oxygen double bond is stable. Thus, the use of the metal complex having the metal-oxygen double bond makes it possible to drive the light-emitting element more stably at low voltage.

As a metal complex having a metal-oxygen bond and an aromatic ligand, a phthalocyanine-based material is preferable. In particular, a material in which a metal-oxygen double bond is more likely to act on another molecular in terms of a molecular structure and having a high acceptor property is preferably used.

As the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. For that reason, such a phthalocyanine derivative has an advantage of being easily handled during formation of the light-emitting element. Furthermore, owing to the solubility in a solvent, such a phthalocyanine derivative also has an advantage of facilitating maintenance of an apparatus used for forming a film.

The electron-injection buffer layer is formed over the electron-relay layer. The electron-injection buffer layer relieves a barrier to injection of electrons into the EL layer that is provided closer to the anode and adjacent to the intermediate layer, so that the electron-injection efficiency can be improved.

For the electron-injection buffer layer, the material having an electron-injection property used for the electron-injection layer of the EL layer described above can be used. Examples of the electron-injection substance include an alkali metal, an alkaline earth metal, a rare earth metal, and a compound thereof (e.g., an oxide thereof, a carbonate thereof, and a halide thereof), such as lithium, cesium, calcium, lithium oxide, lithium carbonate, cesium carbonate, lithium fluoride, cesium fluoride, calcium fluoride, and erbium fluoride. Note that the electron-injection buffer layer may have a layer consisting of one of the above-mentioned material having an electron-injection property. That is, the electron-injection buffer layer may have a layer consisting of one of an alkali metal, an alkaline earth metal, a rare earth metal, and a compound thereof (e.g., an oxide thereof, a carbonate thereof, and a halide thereof), such as lithium, cesium, calcium, lithium oxide, lithium carbonate, cesium carbonate, lithium fluoride, cesium fluoride, calcium fluoride, and erbium fluoride.

It is known that ionized alkali metal or alkaline earth metal is an ion with a relatively small radius which moves relatively easily in various layers. If the electron-injection buffer layer is formed without a later-described layer suppressing diffusion of alkali metal or alkaline earth metal provided between the charge generation layer and the electron-injection buffer layer, the alkali metal or alkaline earth metal contained in the material of the electron-injection buffer layer moves through the electron-relay layer and reaches the charge generation layer. However, this problem can be suppressed by the layer having a function of suppressing diffusion of alkali metal or alkaline earth metal which is provided between the charge generation layer and the electron-injection buffer layer as described in one embodiment of the present invention, because the amount of the alkali metal or alkaline earth metal reaching the charge generation layer can be reduced.

A layer is formed between the charge generation layer and the electron-injection buffer layer. The layer has a function of suppressing diffusion of the alkali metal or alkaline earth metal element, which is contained in the material of the electron-injection buffer layer, into the layer on which the electron-injection buffer layer is formed, and suppressing approach of the element to the charge generation layer. The diffusion of the metal into the charge generation layer allows the metal having an electron-donating property (a donor property) with respect to the substance having an acceptor property in the charge generation layer to hinder the function of the substance. This increases the drive voltage of the light-emitting element and decreases its emission efficiency, and thus EL light emission is hindered.

In the case of an ordered-structure tandem light-emitting element, an electron-injection buffer layer of an intermediate layer is formed first, and the layer on which the electron-injection buffer layer is formed is an electron-transport layer or an electron-injection layer of the EL layer that is directly under the intermediate layer. When the alkali metal or alkaline earth metal contained in the material of the electron-injection buffer layer is diffused into the electron-transport layer or the electron-injection layer of the EL layer that is directly under the intermediate layer during the formation of the electron-injection buffer layer, the metal functions as an electron donor (donor). This improves the electron-transport property of the electron-transport layer or the electron-injection layer, contributing to improved characteristics of the light-emitting element. Hence, the diffusion of the alkali metal or alkaline earth metal does not cause a problem.

In the case of an inverted-structure tandem light-emitting element, the alkali metal or alkaline earth metal contained in the material of the electron-injection buffer layer is diffused into the charge generation layer during the formation of the intermediate layer. This causes the following problem. The metal serving as an electron donor (donor) causes carrier recombination with a material having an acceptor property in the charge generation layer and hinders the function of the charge generation layer, which increases the drive voltage of the light-emitting element and decreases its emission efficiency. This degrades the performance of the light-emitting element. The electron-relay layer between the electron-injection buffer layer and the charge generation layer is insufficient to suppress the adverse effect of the diffusion of the alkali metal or alkaline earth metal. To solve the problem caused by the diffusion of the alkali metal or alkaline earth metal, the layer capable of suppressing diffusion of the alkali metal or alkaline earth metal element is provided in one embodiment of the present invention.

The layer capable of suppressing diffusion of the alkali metal or alkaline earth metal element preferably contains a material having a high electron-transport property, especially preferably an organic compound material that enables the alkali metal or alkaline earth metal, which has been diffused and mixed, to function as an electron donor (donor). A composite material in which the alkali metal or alkaline earth metal is mixed with such an organic compound material to serve as an electron donor (donor) has an excellent electron-transport property because electrons are generated in the organic compound by the electron donor. In this case, the organic compound preferably has an excellent property of transporting the generated electrons.

Specifically, a metal complex such as $Alq_3$, $Almq_3$, $BeBq_2$, BAlq, ZnPBO, or ZnBTZ can be used. Furthermore, a heteroaromatic compound such as PBD, OXD-7, TAZ, 3-(4-tert-butylphenyl)-4-(4-ethylphenyl)-5-(4-biphenylyl)-1,2,4-triazole (abbreviation: p-EtTAZ), Bphen, BCP, or 4,4'-bis(5-methylbenzoxazol-2-yl)stilbene (abbreviation: BzOs) can also be used. Furthermore, alternatively, it is possible to use a high molecular compound such as poly(2,5-pyridin-ediyl) (abbreviation: PPy), poly[(9,9-dihexylfluorene-2,7-diyl)-co-(pyridine-3,5-diyl)] (abbreviation: PF-Py) or poly [(9,9-dioctylfluorene-2,7-diyl)-co-(2,2'-bipyridine-6,6'-diyl)] (abbreviation: PF-BPy). Note that the layer capable of suppressing diffusion of the alkali metal or alkaline earth metal element may consist of one of the metal complex such as $Alq_3$, $Almq_3$, $BeBq_2$, BAlq, ZnPBO, or ZnBTZ, the heteroaromatic compound such as PBD, OXD-7, TAZ, 3-(4-tert-butylphenyl)-4-(4-ethylphenyl)-5-(4-biphenylyl)-1,2,4-triazole (abbreviation: p-EtTAZ), Bphen, BCP, or 4,4'-bis(5-methylbenzoxazol-2-yl)stilbene (abbreviation: BzOs), and the high molecular compound such as poly(2,5-pyridin-ediyl) (abbreviation: PPy), poly[(9,9-dihexylfluorene-2,7-diyl)-co-(pyridine-3,5-diyl)](abbreviation: PF-Py) or poly [(9,9-dioctylfluorene-2,7-diyl)-co-(2,2'-bipyridine-6,6'-diyl)] (abbreviation: PF-BPy). The materials mentioned here are mainly ones that have an electron mobility of $10^{-6}$ $cm^2/Vs$ or more.

The material of the layer is preferably different from that of the electron-relay layer. When the layer containing a material different from that of the electron-relay layer is combined with the electron-relay layer, the electron-transport property and the function of suppressing the diffusion of the metal can each be adjusted to a suitable degree. The layer is not limited to a single layer and may be a stacked layer of two or more layers.

According to one embodiment of the present invention, both the advantages of the tandem structure and the inverted structure can be enjoyed while suppressing a degradation of the performance of the light-emitting element.

<<Structure of Light-Emitting Element>>

A light-emitting element of one embodiment of the present invention is described with reference to FIG. 1. FIG. 1 is a structural drawing of the light-emitting element, in which the first EL layer 102 is formed over the cathode 101 formed over the substrate 100, the intermediate layer 103 is formed over the first EL layer 102, the second EL layer 104 is formed over the intermediate layer 103, and the anode 105 is formed over the second EL layer 104. In FIG. 1, the first EL layer 102 includes an electron-injection layer 102a, an electron-transport layer 102b, a light-emitting layer 102c, and a hole-transport layer 102d. The intermediate layer 103 includes a charge generation layer 103a, an electron-relay layer 103b, a layer 103c suppressing diffusion of alkali metal or alkaline earth metal, and an electron-injection buffer layer 103d. The second EL layer includes an electron-transport layer 104a, a light-emitting layer 104b, a hole-transport layer 104c, and a hole-injection layer 104d.

Figure 2:
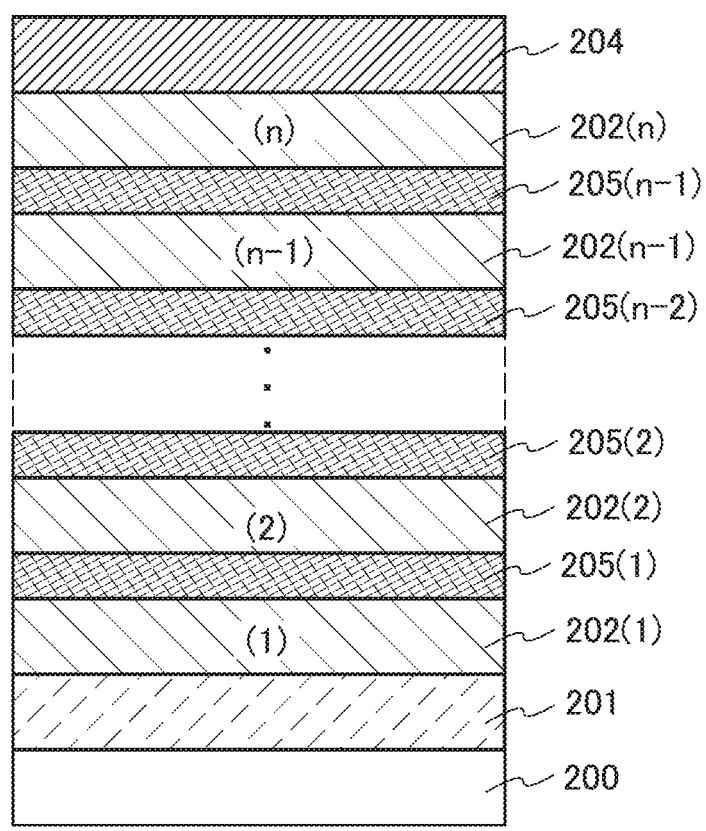
FIG. 2 illustrates a structure of a light-emitting element.

Although the light-emitting element in this embodiment has two EL layers, the present invention can be similarly applied to a light-emitting element in which n EL layers (202(1) to 202(n)) (n is three or more) are stacked and intermediate layers (205(1) to 205(n−1)) each including a layer having a function of suppressing diffusion of alkali metal or alkaline earth metal are each between two adjacent EL layers in the n EL layers (202(1) to 202(n)) as illustrated in FIG. 2. When there are a plurality of EL layers between the cathode and the anode as in the light-emitting element according to this embodiment, the advantage of the tandem light-emitting element can be enjoyed even with an inverted structure because of the intermediate layer including a layer having a function of suppressing diffusion of alkali metal or alkaline earth metal between the EL layers. In other words, light can be emitted with high luminance while current density is kept low. Since the current density can be kept low, the element can have a long lifetime. When applied to light-emitting devices, electronic appliances, and lighting devices each having a large light-emitting area, the light-emitting element enables uniform light emission in a large area because voltage drop due to resistance of an electrode material can be reduced.

Furthermore, when the emission colors of the EL layers are made different from each other, light of a desired color can be emitted from the light-emitting element as a whole. For example, in the light-emitting element having two EL layers, when the emission color of the first EL layer and the emission color of the second EL layer are complementary colors, a light-emitting element emitting white light as a whole can also be obtained. Note that "complementary colors" refer to colors that can produce an achromatic color when mixed. In other words, emission of white light can be obtained by mixture of light emitted from substances whose emission colors are complementary colors.

The same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined with the structure described in any of the other embodiments as appropriate.

Embodiment 2

In this embodiment, a light-emitting device including the light-emitting element described in Embodiment 1 is described.

The light-emitting device may be either a passive matrix type light-emitting device or an active matrix type light-emitting device. The light-emitting element described in Embodiment 1 can be applied to the light-emitting device described in this embodiment.

In this embodiment, an active matrix type light-emitting device is described with reference to FIGS. 3A and 3B.

Figure 3A:
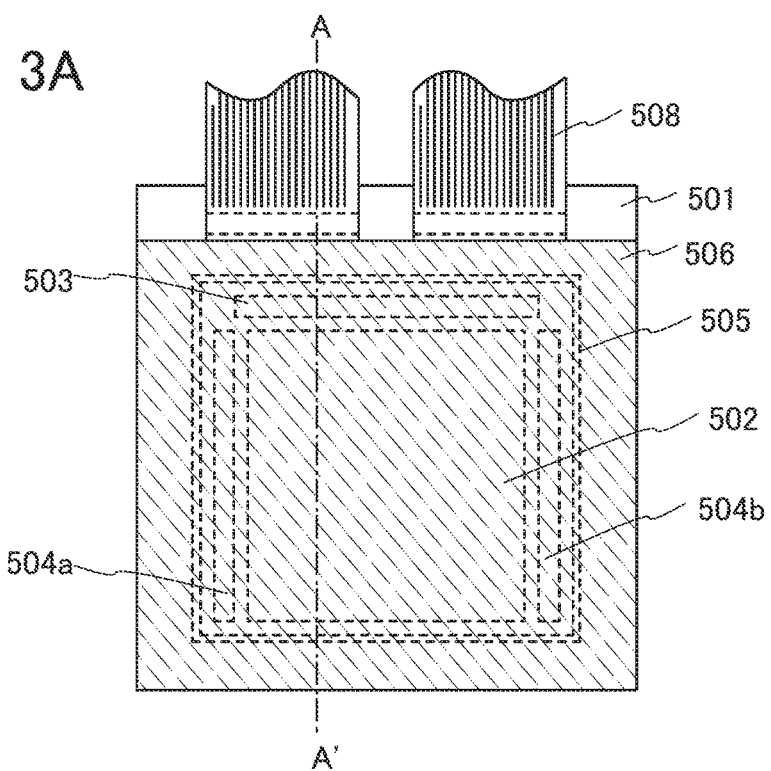
FIGS. 3A and 3B illustrate a light-emitting device.
Figure 3B:
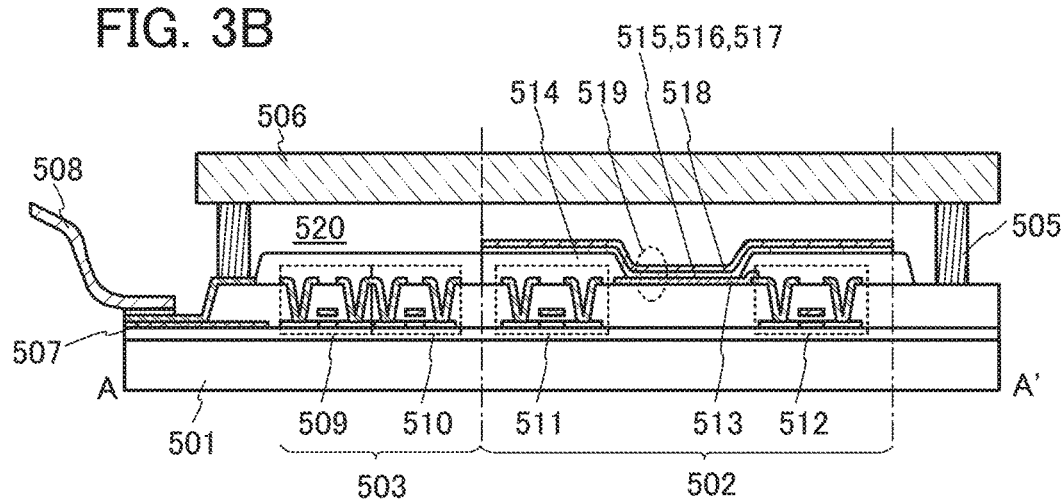

FIG. 3A is a top view illustrating a light-emitting device and FIG. 3B is a cross-sectional view taken along the chain line A-A' in FIG. 3A. The active matrix type light-emitting device according to this embodiment includes a pixel portion 502 provided over an element substrate 501, a driver circuit portion (a source line driver circuit) 503, and driver circuit portions (gate line driver circuits) 504a and 504b. The pixel portion 502, the driver circuit portion 503, and the driver circuit portion 504a and 504b are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portions 504a and 504b, is provided. Here, an example is described in which a flexible printed circuit (FPC) 508 is provided as the external input terminal. Although only the FPC is illustrated here, the FPC may be provided with a printed wiring board (PWB). The light-emitting device in this specification includes, in its category, not only the light-emitting device itself but also the light-emitting device provided with the FPC or the PWB.

Next, a cross-sectional structure is described with reference to FIG. 3B. The driver circuit portion and the pixel portion are formed over the element substrate 501; the driver circuit portion 503 which is the source line driver circuit and the pixel portion 502 are illustrated here.

The driver circuit portion 503 is an example where a CMOS circuit is formed, which is a combination of an n-channel FET 509 and a p-channel FET 510. Note that a circuit included in the driver circuit portion may be formed using various CMOS circuits, PMOS circuits, or NMOS circuits. Any of a staggered type FET and a reverse-staggered type FET can be used. The crystallinity of a semiconductor film used in the FET is not limited and can be amorphous or crystalline. In addition, an oxide semiconductor may be used for a semiconductor layer. Although a driver integrated type in which the driver circuit is formed over the substrate is described in this embodiment, the driver circuit is not necessarily formed over the substrate, and the driver circuit can be formed outside.

The pixel portion 502 is formed of a plurality of pixels each of which includes a switching FET 511, a current control FET 512, and a cathode 513 which is electrically connected to a wiring (a source electrode or a drain electrode) of the current control FET 512. An insulator 514 is formed to cover edge portions of the cathode 513. Here the insulator 514 is formed using a positive photosensitive acrylic resin.

The insulator 514 preferably has a curved surface with curvature at an upper edge portion or a lower edge portion thereof in order to obtain favorable coverage by a film which is to be stacked over the insulator 514. For example, in the case of using a positive photosensitive acrylic resin as a material for the insulator 514, the insulator 514 is preferably formed so as to have a curved surface with a curvature radius (0.2 µm to 3 µm) at the upper edge portion. The insulator 514 can be formed using either a negative photosensitive resin or a positive photosensitive resin. The material of the insulator 514 is not limited to an organic compound and an inorganic compound such as silicon oxide or silicon oxynitride can also be used.

Over the cathode 513, a first EL layer 515, an intermediate layer 516, a second EL layer 517, and an anode 518 are stacked. At least a light-emitting layer is provided in each of the first EL layer 515 and the second EL layer 517. Furthermore, in each of the first EL layer 515 and the second EL layer 517, a hole-injection layer, a hole-transport layer, an electron-transport layer, an electron-injection layer, a charge generation layer, and the like can be provided as appropriate in addition to the light-emitting layer. Note that the components including the cathode 513 to the anode 518 can be considered as the light-emitting element described in Embodiment 1.

The cathode 513; the first EL layer 515, the intermediate layer 516, and the second EL layer 517 (collectively illustrated); and the second electrode (anode) 518 are formed. For the cathode 513, the first EL layer 515, the intermediate layer 516, the second EL layer 517, and the anode 518, the materials described in Embodiment 1 can be used. Although not illustrated, the anode 518 is electrically connected to the FPC 508 which is an external input terminal.

In addition, although the cross-sectional view of FIG. 3B illustrates only one light-emitting element 519, a plurality of light-emitting elements are arranged in a matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be fabricated by a combination with color filters.

Furthermore, the sealing substrate 506 is attached to the element substrate 501 with the sealant 505, whereby a light-emitting element 519 is provided in a space 520 surrounded by the element substrate 501, the sealing substrate 506, and the sealant 505. Note that the space 520 may be filled with an inert gas (such as nitrogen and argon) or the sealant 505.

An epoxy-based resin is preferably used for the sealant 505. The material preferably allows as little moisture and oxygen as possible to penetrate. As the sealing substrate 506, a glass substrate, a quartz substrate, or a plastic substrate formed of fiber-reinforced plastic (FRP), poly(vinyl fluoride) (PVF), a polyester, acrylic, or the like can be used.

Note that in this specification and the like, a transistor and a light-emitting element can be formed using any of a variety of substrates. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate, the attachment film, the base film, and the like are substrates of plastics typified by polyethylene terephthalate (PET), polyethylene naphthalate (PEN), and polyether sulfone (PES). Other examples are substrates of synthetic resins such as acrylic. Other examples are polypropylene, polyester, polyvinyl fluoride, polyvinyl chloride, and the like. Other examples are polyamide, polyimide, aramid, epoxy, an inorganic vapor deposition film, paper, and the like. In particular, when a transistor is formed using a semiconductor substrate, a single crystal substrate, an SOI substrate, or the like, the transistor can have few variations in characteristics, size, shape, or the like, high current supply capability, and a small size. Forming a circuit with the use of such transistors leads to a reduction in power consumption of the circuit or high integration of the circuit.

Alternatively, a flexible substrate may be used as the substrate such that the transistor and the light-emitting element may be provided directly on the flexible substrate. Still alternatively, a separation layer may be provided between the substrate and the transistor and between the substrate and the light-emitting element. The separation layer can be used when part or the whole of a semiconductor device formed over the separation layer is separated from the substrate and transferred onto another substrate. In such a case, the transistor and the light-emitting element can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, after the transistor and the light-emitting element is formed using a substrate, the transistor and the light-emitting element may be transferred to another substrate. Example of the substrate to which the transistor and the light-emitting element are transferred are, in addition to the above substrate over which the transistor and the light-emitting element can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

As described above, the active matrix type light-emitting device can be obtained.

Note that the structure described in this embodiment can be combined as appropriate with any of the structures described in the other embodiments.

Embodiment 3

In this embodiment, examples of a variety of electronic appliances fabricated using a light-emitting device including the light-emitting element described in Embodiment 1 are described with reference to FIGS. 4A to 4D.

Examples of electronic appliances that include the light-emitting device are television devices (also referred to as TV or television receivers), monitors for computers and the like, cameras such as digital cameras and digital video cameras, digital photo frames, cellular phones (also referred to as portable telephone devices), portable game consoles, portable information terminals, audio playback devices, large game machines such as pin-ball machines, and the like. Specific examples of these electronic appliances are illustrated in FIGS. 4A to 4D.

Figure 4A:
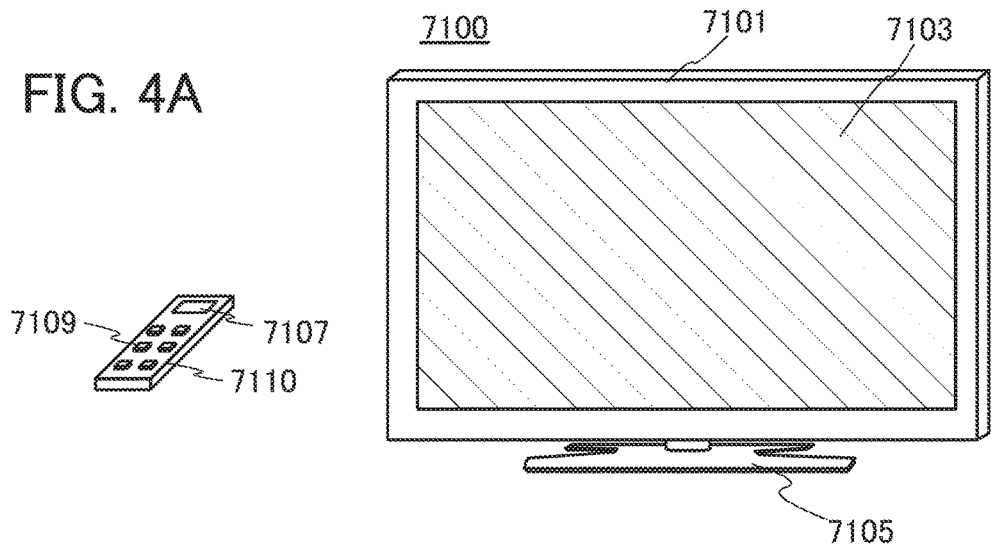
FIGS. 4A to 4D illustrate electronic appliances.

FIG. 4A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105. Note that the display portion 7103 includes the light-emitting device in which the light-emitting elements described in Embodiment 1 are arranged in a matrix.

The television device 7100 can be operated by an operation switch of the housing 7101 or a separate remote controller 7110. With operation keys 7109 of the remote controller 7110, channels and volume can be controlled and images displayed on the display portion 7103 can be controlled. Channels can be switched and volume can be controlled with operation keys 7109 of the remote controller 7110, whereby an image displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wirings via the modem, one-way (from a sender to a receiver) or two-way (between a sender and a receiver or between receivers) information communication can be performed.

Figure 4B:
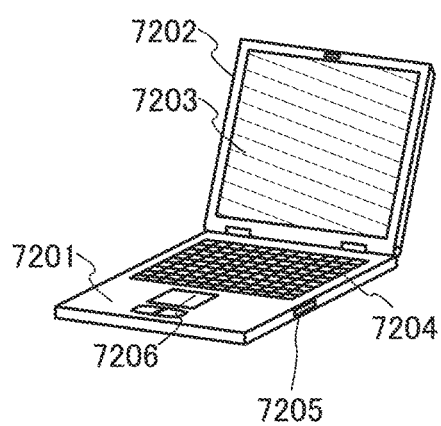

FIG. 4B illustrates a computer, which includes a main body 7201, a housing 7202, a display portion 7203, a keyboard 7204, an external connection port 7205, a pointing device 7206, and the like. Note that this computer is manufactured using the light-emitting device for the display portion 7203. Note that the display portion 7203 includes the light-emitting device in which the light-emitting elements described in Embodiment 1 are arranged in a matrix.

Figure 4C:
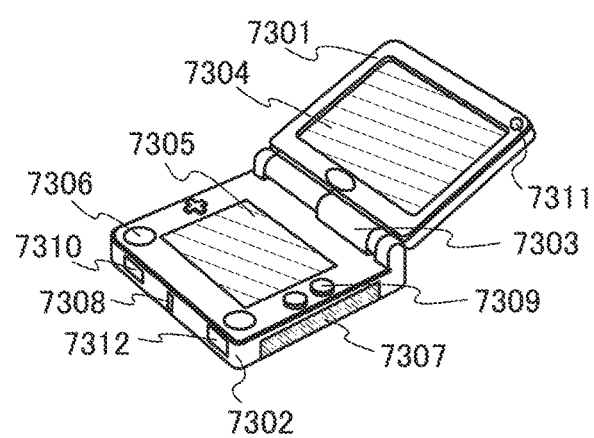

FIG. 4C illustrates a portable game console, which includes two housings, i.e., a housing 7301 and a housing 7302, connected to each other via a joint portion 7303 so that the portable game console can be opened or closed. A display portion 7304 is incorporated in the housing 7301 and a display portion 7305 is incorporated in the housing 7302. Note that the display portions 7304 and 7305 include the light-emitting device in which the light-emitting elements described in Embodiment 1 are arranged in a matrix.

In addition, the portable game console illustrated in FIG. 4C includes a speaker portion 7306, a recording medium insertion portion 7307, an LED lamp 7308, an input means (an operation key 7309, a connection terminal 7310, microphone 7312, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. It is needless to say that the structure of the portable game console is not limited to the above as long as the light-emitting device is used for at least either the display portion 7304 or the display portion 7305, or both, and may include other accessories as appropriate.

The portable game console illustrated in FIG. 4C has a function of reading out a program or data stored in a storage medium to display it on the display portion, and a function of sharing information with another portable game console by wireless communication. Note that the portable game console illustrated in FIG. 4C can have a variety of functions without limitation to those above.

Figure 4D:
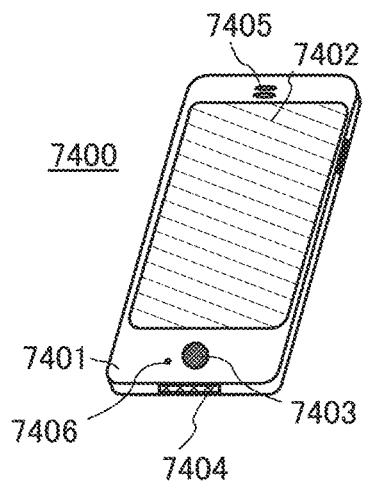

FIG. 4D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device for the display portion 7402. Note that the display portion 7402 includes the light-emitting device in which the light-emitting elements described in Embodiment 1 are arranged in a matrix.

When the display portion 7402 of the cellular phone 7400 illustrated in FIG. 4D is touched with a finger or the like, data can be input into the cellular phone 7400. In addition, operations such as making a call and composing an e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyro sensor or an acceleration sensor is provided inside the cellular phone 7400, display on the screen of the display portion 7402 can be automatically changed by determining the orientation of the cellular phone 7400 (whether the cellular phone is placed horizontally or vertically).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when it is determined that input by touch on the display portion 7402 is not performed within a specified period on the basis of a signal detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. In addition, when a backlight or a sensing light source is provided in the display portion, an image of a finger vein, a palm vein, or the like can be taken.

Figure 5A:
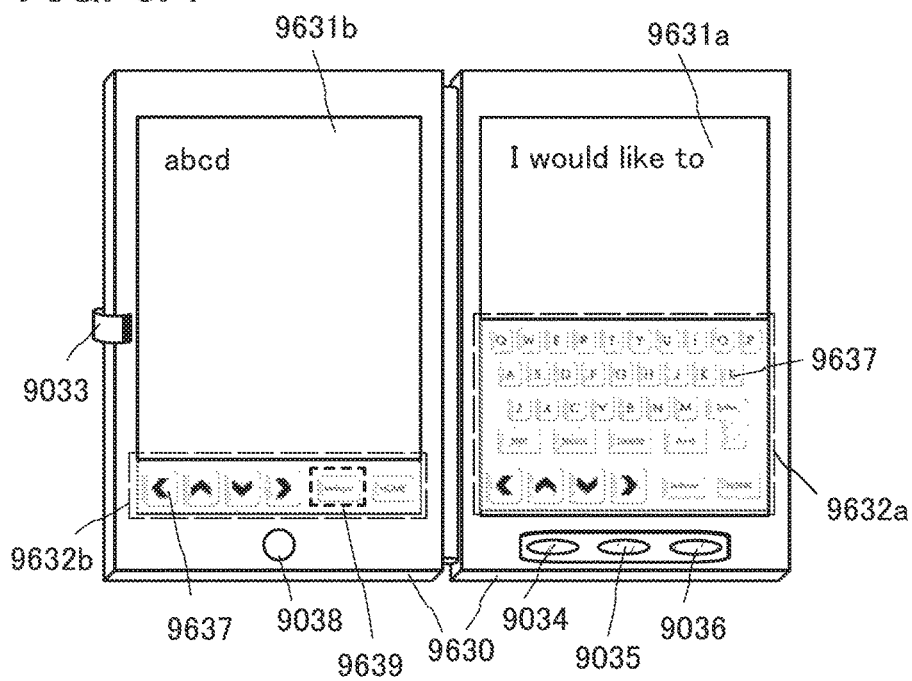
FIGS. 5A to 5C illustrate an electronic appliance.
Figure 5B:
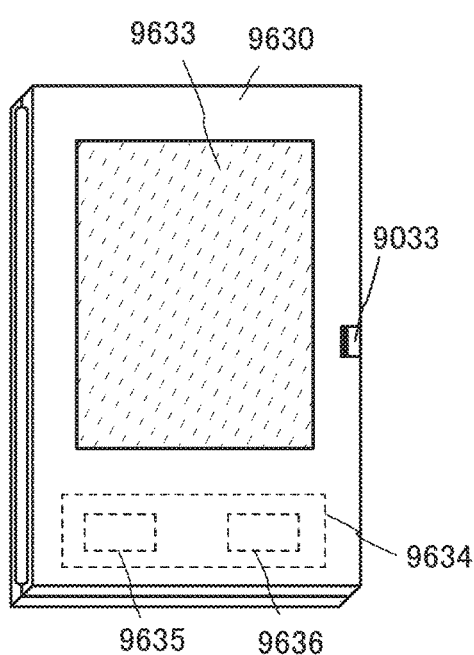

FIGS. 5A and 5B illustrate a foldable tablet terminal. The tablet terminal is opened in FIG. 5A. The tablet terminal includes a housing 9630, a display portion 9631*a*, a display portion 9631*b*, a display mode switch 9034, a power switch 9035, a switch 9036 for switching to power-saving mode, a clasp 9033, and an operation switch 9038. The tablet terminal is manufactured using the light-emitting device for either the display portion 9631*a* or the display portion 9631*b* or both. Note that one or both of the display portions 9631*a* and 9631*b* include a light-emitting device in which the light-emitting elements described in Embodiment 1 are arranged in a matrix.

Part of the display portion 9631*a* can be a touch panel region 9632*a* and data can be input when a displayed operation key 9637 is touched. Although a structure in which a half region in the display portion 9631*a* has only a display function and the other half region also has a touch panel function is shown as an example, the display portion 9631*a* is not limited to the structure. The whole region in the display portion 9631*a* may have a touch panel function. For example, the display portion 9631*a* can display keyboard buttons in the whole region to be a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The display mode switch 9034 can switch the display between portrait mode, landscape mode, and the like, and between monochrome display and color display, for example. The switch 9036 for switching to power-saving mode can control display luminance in accordance with the amount of external light in use of the tablet terminal that is measured with an optical sensor incorporated in the tablet terminal. The tablet terminal may include another detection device such as a gyro sensor or an acceleration sensor in addition to the optical sensor.

Note that FIG. 5A shows an example in which the display portion 9631*a* and the display portion 9631*b* have the same display area; however, without limitation thereon, one of the display portions may be different from the other display portion in size and display quality. For example, higher definition images may be displayed on one of the display portions 9631*a* and 9631*b*.

The tablet terminal is closed in FIG. 5B. The tablet terminal includes the housing 9630, a solar cell 9633, a charge and discharge control circuit 9634, a battery 9635, and a DCDC converter 9636.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

The tablet terminal illustrated in FIGS. 5A and 5B can also have a function of displaying various kinds of data, such as a calendar, a date, or the time, on the display portion as a still image, a moving image, and a text image, a function of displaying, a touch-input function of operating or editing data displayed on the display portion by touch input, a function of controlling processing by various kinds of software (programs), and the like.

The solar cell 9633 provided on a surface of the tablet terminal can supply power to the touch panel, the display portion, a video signal processing portion, or the like. Note that a structure in which the solar cell 9633 is provided is preferable because the battery 9635 which supplies electric power to one or both of the display portion 9631*a* and the display portion 9631*b* can be charged. The use of a lithium ion battery as the battery 9635 is advantageous in downsizing or the like.

Figure 5C:
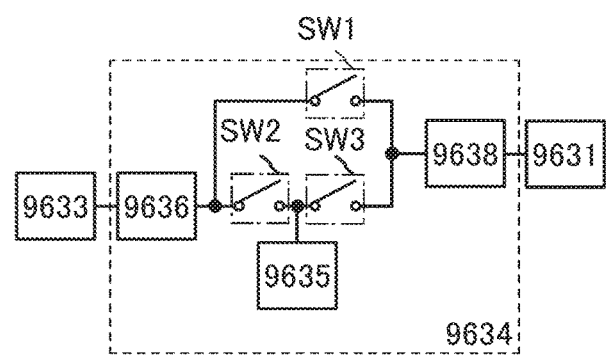

The structure and the operation of the charge and discharge control circuit 9634 illustrated in FIG. 5B will be described with reference to a block diagram in FIG. 5C. The solar cell 9633, the battery 9635, the DCDC converter 9636, a converter 9638, switches SW1 to SW3, and the display portion 9631 are illustrated in FIG. 5C, and the battery 9635, the DCDC converter 9636, the converter 9638, and the switches SW1 to SW3 correspond to those in the charge and discharge control circuit 9634 illustrated in FIG. 5B.

An example of the operation in the case where power is generated by the solar cell 9633 using external light is described. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9638 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

As described above, the light-emitting elements included in the light-emitting device of the aforementioned electronic appliances are the light-emitting elements described in Embodiment 1 and have high emission efficiency, low drive voltage, and a long lifetime. Hence, electronic appliances with reduced power consumption, low drive voltage, and high reliability can be manufactured. It is needless to say that one embodiment of the present invention is not limited to the electronic appliances illustrated in FIGS. 5A to 5C as long as the display portion described in the above embodiment is included.

As described above, the electronic appliances can be obtained by application of the light-emitting device of one embodiment of the present invention. The light-emitting device has a significantly wide application range, and can be applied to electronic appliances in a variety of fields.

Note that the structure described in this embodiment can be combined as appropriate with any of the structures described in the other embodiments.

Embodiment 4

In this embodiment, examples of lighting devices including a light-emitting device including the light-emitting elements described in Embodiment 1 are described with reference to FIG. 6.

FIG. 6 illustrates an example in which the light-emitting device is used as an indoor lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Thus, the lighting device can be elaborately designed in a variety of ways. In addition, a wall of the room may be provided with a large-sized lighting device 8003.

When the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices in which the light-emitting device is used can be obtained. Note that the lighting device described in this embodiment includes the light-emitting device in which the light-emitting elements described in Embodiment 1 are arranged in a matrix. The light-emitting element included in the light-emitting device can have high emission efficiency. In addition, the light-emitting element can be driven at low voltage. Furthermore, the light-emitting elements can have a long lifetime. Accordingly, the lighting device to which the light-emitting device including the light-emitting elements can have reduced power consumption. In addition, the light-emitting device can have low drive voltage. Furthermore, the lighting device can be a lighting device having high reliability. Note that such lighting devices are also embodiments of the present invention.

Note that the structure described in this embodiment can be combined as appropriate with any of the structures described in the other embodiments.

Embodiment 5

In this embodiment, a light-emitting device fabricated using the light-emitting element of one embodiment of the present invention will be described with reference to FIGS. 13A and 13B.

Figure 13A:
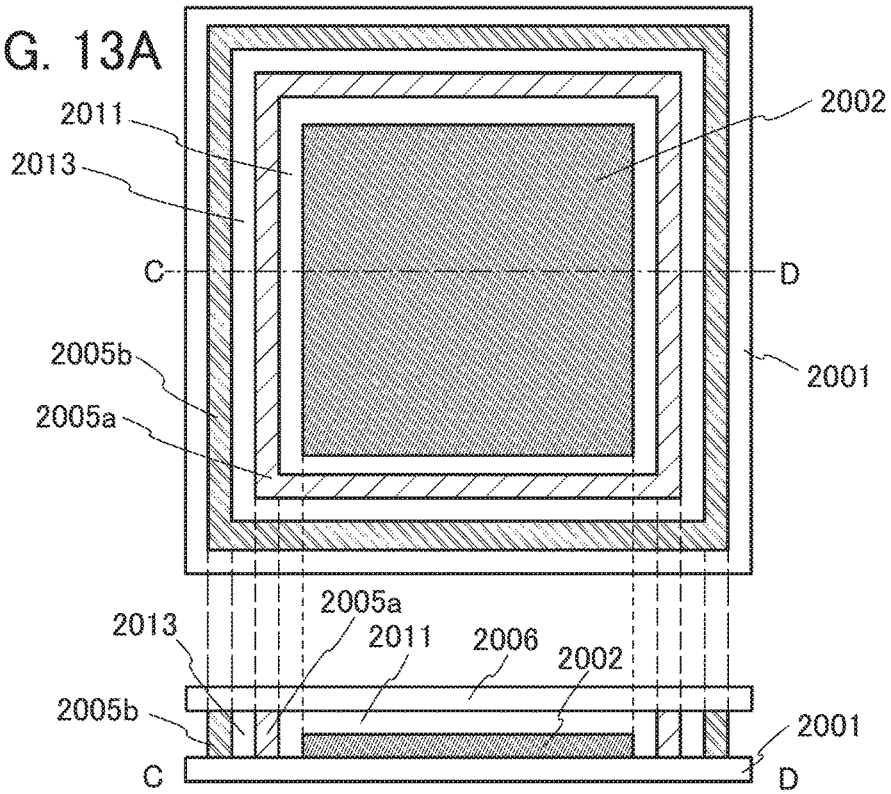
FIGS. 13A and 13B each illustrate a light-emitting device of one embodiment of the present invention.

In FIG. 13A, a plan view of a light-emitting device described in this embodiment and a cross-sectional view taken along the dashed-dotted line C-D in the plan view are illustrated.

The light-emitting device illustrated in FIG. 13A includes a light-emitting portion 2002 including an inverted-structure tandem light-emitting element over a first substrate 2001. The light-emitting device has a structure in which a first sealant 2005*a* is provided so as to surround the light-emitting portion 2002 and a second sealant 2005*b* is provided so as to surround the first sealant 2005*a* (i.e., a double sealing structure).

Thus, the light-emitting portion 2002 is positioned in a space surrounded by the first substrate 2001, the second substrate 2006, and the first sealant 2005*a*. The light-emitting portion 2002 includes the light-emitting element described in Embodiment 1.

Note that in this specification, the first sealant 2005*a* and the second sealant 2005*b* are not necessarily in contact with the first substrate 2001 and the second substrate 2006. For example, the first sealant 2005*a* may be in contact with an insulating film or a conductive film formed over the first substrate 2001.

In the above structure, the first sealant 2005*a* is a resin layer containing a desiccant and the second sealant 2005*b* is a glass layer, whereby an effect of suppressing entry of impurities such as moisture and oxygen from the outside (hereinafter, referred to as a sealing property) can be increased.

The first sealant 2005a is the resin layer as described above, whereby the glass layer that is the second sealant 2005b can be prevented from having breaking or cracking (hereinafter, collectively referred to as a crack). Further, in the case where the sealing property of the second sealant 2005b is not sufficient, even when impurities such as moisture and oxygen enter a first space 2013, entry of the impurities into a second space 2011 can be suppressed because of a high sealing property of the first sealant 2005a. Thus, deterioration of an organic compound, a metal material, and the like contained in the light-emitting element due to entry of impurities can be suppressed.

Figure 13B:
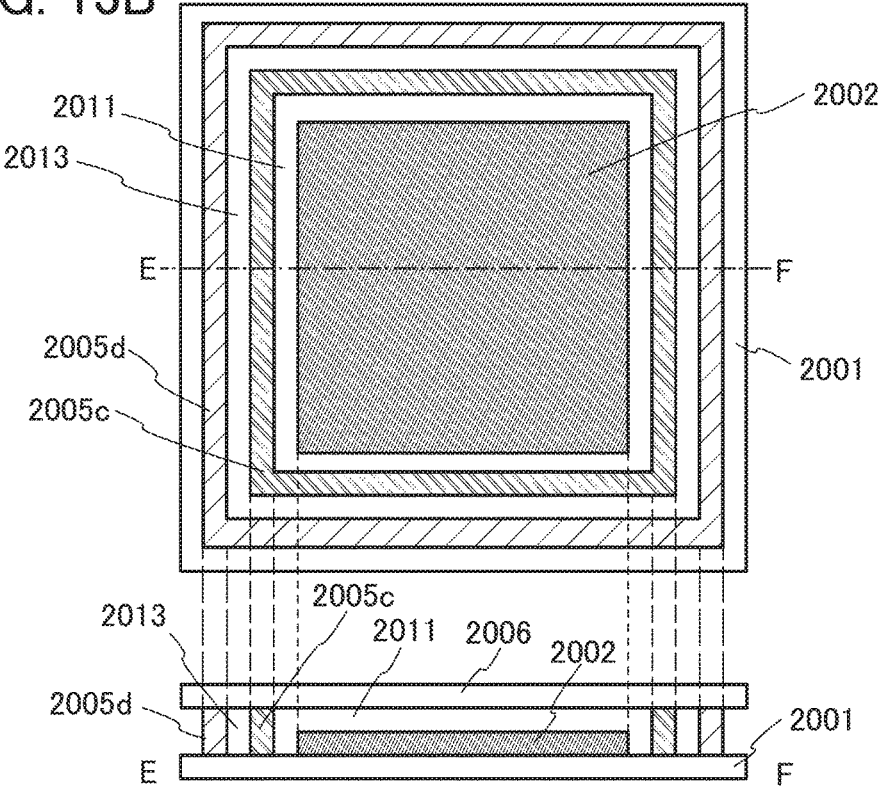

In addition, the structure illustrated in FIG. 13B can be employed: the first sealant 2005c is a glass layer and the second sealant 2005d is a resin layer containing a desiccant.

In the light-emitting device described in this embodiment, distortion due to external force or the like increases toward the outer portion of the light-emitting device. In view of this, the first sealant 2005c which has relatively small distortion due to external force or the like is a glass layer and the second sealant 2005d is a resin layer which has excellent impact resistance and excellent heat resistance and is not easily broken by deformation due to external force or the like, whereby entry of moisture and oxygen into the first space 2013 can be suppressed.

In addition to the above structure, a material serving as a desiccant may be contained in each of the first space 2013 and the second space 2011.

In the case where the first sealant 2005c in FIG. 13B or the second sealant 2005b in FIG. 13A is a glass layer, for example, a glass frit or a glass ribbon can be used. Note that at least a glass material is contained in a glass frit or a glass ribbon.

The glass frit contains a glass material as a frit material. The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one or more kinds of transition metals to absorb infrared light.

Further, in the case where a glass layer is formed using any of the above glass frits, for example, a frit paste is applied to a substrate and is subjected to heat treatment, laser light irradiation, or the like. The frit paste contains the frit material and a resin (also referred to as a binder) diluted with an organic solvent. The frit paste can be formed using a known material and a known composition. An absorber which absorbs light having a wavelength of laser light may be added to the frit material. For example, an Nd:YAG laser or a semiconductor laser is preferably used as a laser. The shape of laser light may be circular or quadrangular.

Note that the thermal expansion coefficient of the glass layer to be formed is preferably close to that of the substrate. The closer the thermal expansion coefficients are, the more generation of a crack in the glass layer or the substrate due to thermal stress can be suppressed.

Although any of known materials, for example, photocurable resins such as an ultraviolet curable resin and thermosetting resins can be used in the case where the first sealant 2005a in FIG. 13A or the second sealant 2005d in FIG. 13B is a resin layer, it is particularly preferable to use a material which does not transmit moisture or oxygen. In particular, a photocurable resin is preferably used. The light-emitting element contains a material having low heat resistance in some cases. A photocurable resin, which is cured by light irradiation, is preferably used, in which case change in film quality and deterioration of an organic compound itself caused by heating of the light-emitting element can be suppressed. Furthermore, any of the organic compounds that can be used for the light-emitting element of one embodiment of the present invention may be used.

As the desiccant contained in the resin layer, the first space 2013, or the second space 2011, a known material can be used. As the desiccant, a substance which adsorbs moisture by chemical adsorption or a substance which adsorbs moisture by physical adsorption can be used. Examples thereof are alkali metal oxides, alkaline earth metal oxide (e.g., calcium oxide and barium oxide), sulfate, metal halides, perchlorate, zeolite, silica gel, and the like.

One or both of the first space 2013 and the second space 2011 may have, for example, an inert gas such as a rare gas or a nitrogen gas or may contain an organic resin. Note that these spaces are each in an atmospheric pressure state or a reduced pressure state.

As described above, the light-emitting device described in this embodiment has a double sealing structure, in which one of the first sealant and the second sealant is the glass layer having excellent productivity and an excellent sealing property, and the other is the resin layer which is hardly broken because of external force or the like, and can contain the desiccant inside, so that a sealing property of suppressing entry of impurities such as moisture and oxygen from the outside can be improved.

Thus, the use of the structure described in this embodiment can provide a light-emitting device in which deterioration of a light-emitting element due to impurities such as moisture and oxygen is suppressed.

Note that the structure described in this embodiment can be combined with any of the structures described in the other embodiments and the examples as appropriate.

Embodiment 6

In this embodiment, a light-emitting device fabricated using the light-emitting element of one embodiment of the present invention will be described with reference to FIG. 14.

Figure 14:
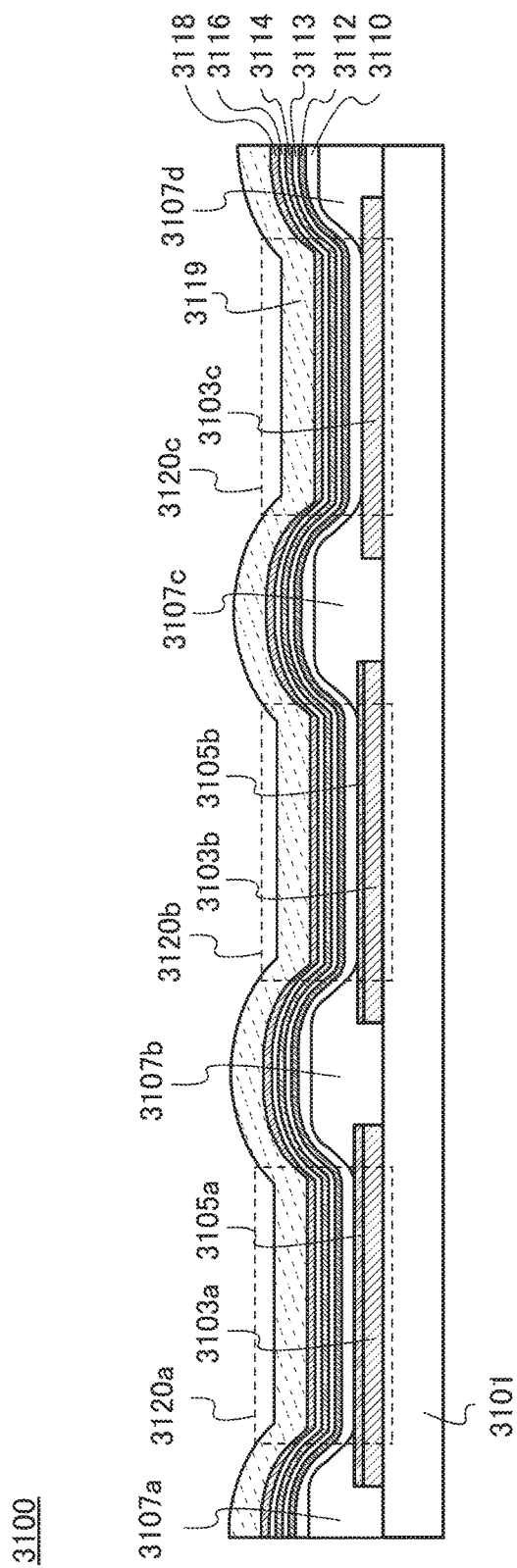
FIG. 14 illustrates a light-emitting device of one embodiment of the present invention.

A light-emitting device 3100 illustrated in FIG. 14 includes light-emitting elements 3120a, 3120b, and 3120c. The light-emitting elements 3120a, 3120b, and 3120c are tandem light-emitting elements in which a plurality of light-emitting layers are provided between lower electrodes 3103a, 3103b, and 3103c and an upper electrode 3119.

The light-emitting device 3100 includes the island-shaped lower electrodes 3103a, 3103b, and 3103c over a substrate 3101. The lower electrodes 3103a, 3103b, and 3103c can function as cathodes of the light-emitting elements. Note that reflective electrodes may be provided under the lower electrodes 3103a, 3103b, and 3103c. Transparent conductive layers 3105a and 3105b may be provided over the lower electrodes 3103a and 3103b. The transparent conductive layers 3105a and 3105b preferably have different thicknesses depending on the emission color of the element. Although not illustrated, a transparent conductive layer may also be provided over the lower electrode 3103c.

Furthermore, the light-emitting device 3100 includes partitions 3107a, 3107b, 3107c, and 3107d. Specifically, the partition 3107a covers one edge portion of the lower electrode 3103a and one edge portion of the transparent conductive layer 3105a. The partition 3107b covers the other edge portion of the lower electrode 3103a and the other edge portion of the transparent conductive layer 3105a and also covers one edge portion of the lower electrode 3103b and one edge portion of the transparent conductive layer 3105b. The partition 3107c covers the other edge portion of the lower electrode 3103b and the other edge portion of the transparent conductive layer 3105b and also covers one edge portion of the lower electrode 3103c and one edge portion of the transparent conductive layer 3105c. The partition 3107d covers the other edge portion of the lower electrode 3103c and the other edge portion of the transparent conductive layer 3105c.

Furthermore, the light-emitting device 3100 includes a first EL layer 3110 over the lower electrodes 3103a, 3103b, and 3103c and the partitions 3107a, 3107b, 3107c, and 3107d. The first EL layer includes an electron-injection layer, an electron-transport layer, a light-emitting layer, and a hole-transport layer.

The light-emitting device 3100 includes a charge generation layer 3112 of an intermediate layer over the first EL layer 3110 and, over the charge generation layer 3112, an electron-relay layer 3113 of the intermediate layer.

The light-emitting device 3100 includes a layer 3114 and an electron-injection buffer layer 3116 over the electron-relay layer 3113. The layer 3114 has a function of suppressing diffusion of alkali metal or alkaline earth metal contained in the electron-injection buffer layer 3116 and the like.

The light-emitting device 3100 includes a second EL layer 3118 over the electron-injection buffer layer 3116 of the intermediate layer. The second EL layer includes an electron-transport layer, a light-emitting layer, a hole-transport layer, and a hole-injection layer. The light-emitting device further includes the upper electrode 3119 over the second EL layer 3118. The upper electrode 3119 can function as anodes of the light-emitting elements.

Note that the structure described in this embodiment can be combined with any of the structures described in the other embodiments and the examples as appropriate.

Embodiment 7

In this embodiment, a lighting device fabricated using the light-emitting element of one embodiment of the present invention is described with reference to FIGS. 15A to 15E.

Figure 15A:
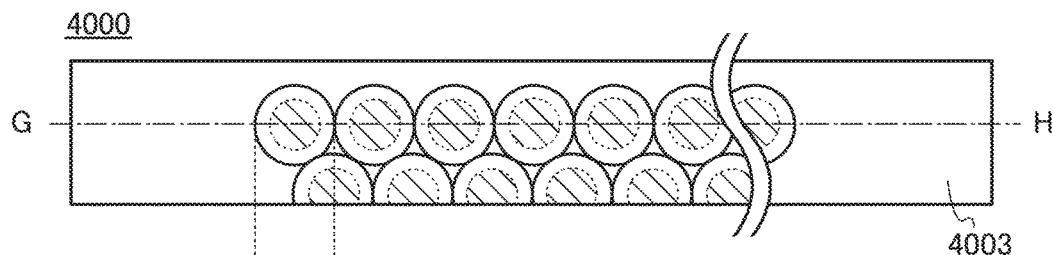
FIGS. 15A to 15E illustrate light-emitting devices of one embodiment of the present invention.
Figure 15B:
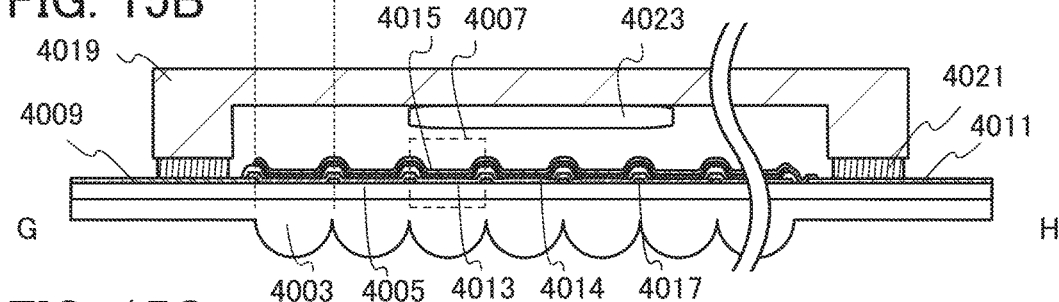
Figure 15C:
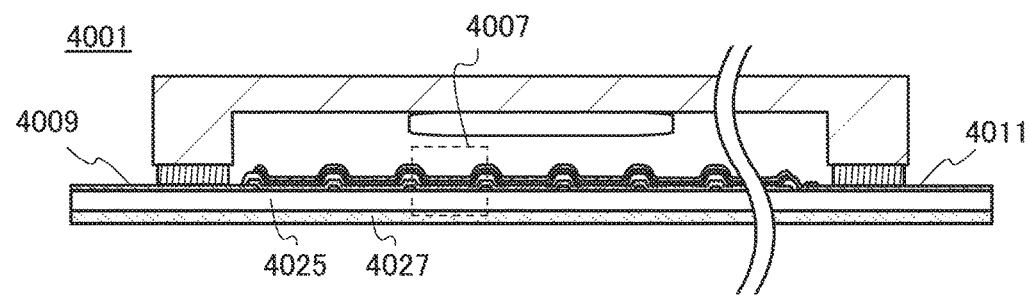

FIGS. 15A to 15E are a plan view and cross-sectional views of lighting devices. FIGS. 15A to 15C illustrate bottom-emission lighting devices in which light is extracted from the substrate side. FIG. 15B is a cross-sectional view taken along the dashed-dotted line G-H in FIG. 15A.

A lighting device 4000 illustrated in FIGS. 15A and 15B includes an inverted-structure tandem light-emitting element 4007 over a substrate 4005. In addition, the lighting device includes a substrate 4003 with unevenness on the outside of the substrate 4005. The inverted-structure tandem light-emitting element 4007 includes a lower electrode 4013, an EL layer 4014, and an upper electrode 4015. Note that the EL layer 4014 includes at least two EL layers and an intermediate layer between the EL layers.

The lower electrode 4013 is electrically connected to an electrode 4009, and the upper electrode 4015 is electrically connected to an electrode 4011. In addition, an auxiliary wiring 4017 electrically connected to the lower electrode 4013 may be provided.

The substrate 4005 and a sealing substrate 4019 are bonded to each other by a sealant 4021. A desiccant 4023 is preferably provided between the sealing substrate 4019 and the light-emitting element 4007.

The substrate 4003 has the unevenness illustrated in FIG. 15A, whereby the extraction efficiency of light emitted from the light-emitting element 4007 can be increased. Instead of the substrate 4003, a diffusion plate 4027 may be provided on the outside of the substrate 4025 as in a lighting device 4001 illustrated in FIG. 15C.

Figure 15D:
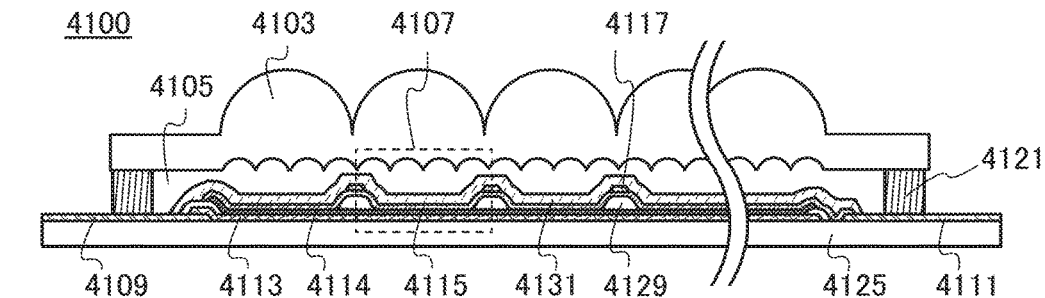
Figure 15E:
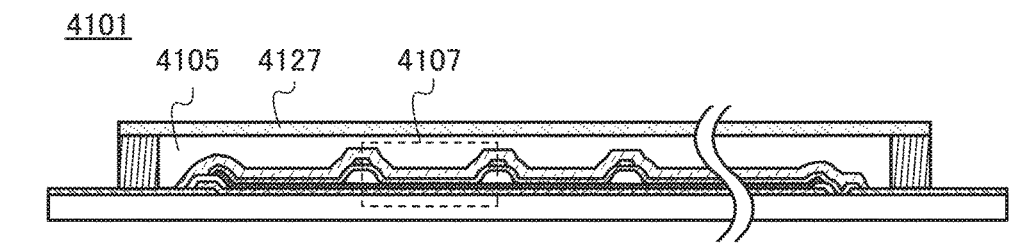

FIGS. 15D and 15E illustrate top-emission lighting devices in which light is extracted from the side opposite to the substrate.

A lighting device 4100 illustrated in FIG. 15D includes an inverted-structure tandem light-emitting element 4107 over a substrate 4125. The light-emitting element 4107 includes a lower electrode 4113, an EL layer 4114, and an upper electrode 4115. Note that the EL layer 4114 includes at least two EL layers and an intermediate layer between the EL layers.

The lower electrode 4113 is electrically connected to an electrode 4109, and the upper electrode 4115 is electrically connected to an electrode 4111. An auxiliary wiring 4117 electrically connected to the upper electrode 4115 may be provided. An insulating layer 4129 may be provided under the auxiliary wiring 4117.

The substrate 4125 and a sealing substrate 4103 with unevenness are bonded to each other by a sealant 4121. A planarization film 4105 and a barrier film 4131 may be provided between the sealing substrate 4103 and the light-emitting element 4107.

The sealing substrate 4103 has the unevenness illustrated in FIG. 15D, whereby the extraction efficiency of light emitted from the light-emitting element 4107 can be increased. Instead of the sealing substrate 4103, a diffusion plate 4127 may be provided over the light-emitting element 4107 as in a lighting device 4101 illustrated in FIG. 15E.

Note that the structure described in this embodiment can be combined with any of the structures described in the other embodiments and the examples as appropriate.

Embodiment 8

In this embodiment, a touch sensor and a module that can be combined with a light-emitting device of one embodiment of the present invention are described with reference to FIGS. 16A and 16B, FIG. 17, FIG. 18, and FIG. 19.

Figure 16A:
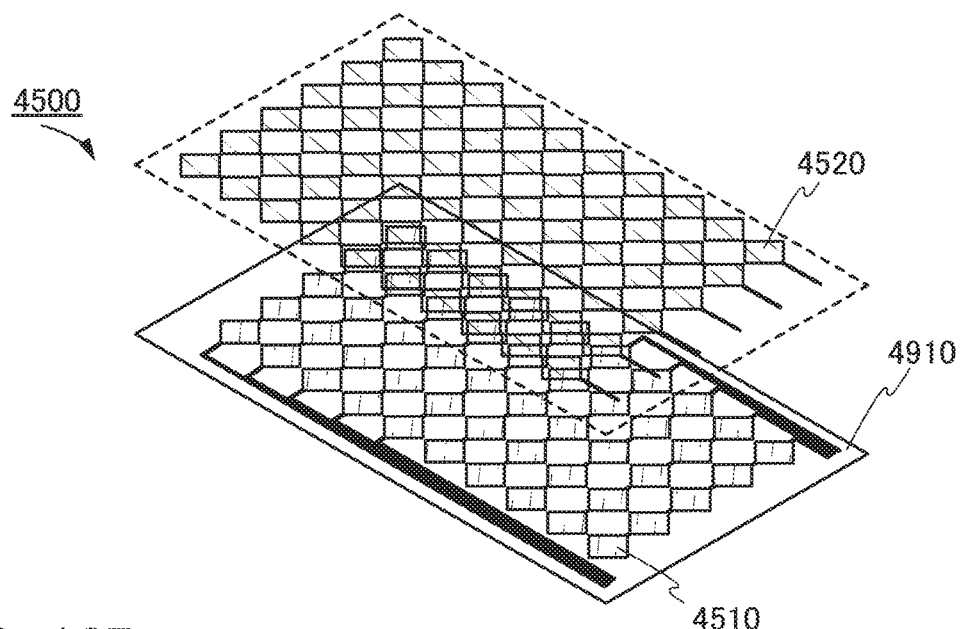
FIGS. 16A and 16B illustrate a touch sensor.
Figure 16B:
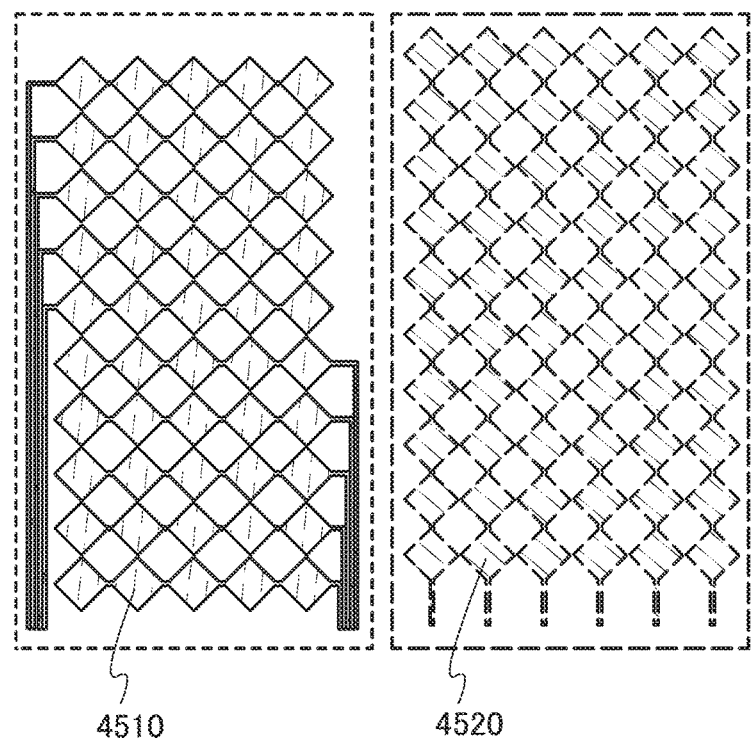

FIG. 16A is an exploded perspective view of a structural example of a touch sensor 4500. FIG. 16B is a plan view of a structural example of an electrode of the touch sensor 4500.

The touch sensor 4500 illustrated in FIGS. 16A and 16B includes, over a substrate 4910, a plurality of conductive layers 4510 arranged in the X-axis direction and a plurality of conductive layers 4520 arranged in the Y-axis direction intersecting with the X-axis direction. In FIGS. 16A and 16B illustrating the touch sensor 4500, a plane over which the plurality of conductive layers 4510 are formed and a plane over which the plurality of conductive layers 4520 are formed are separately illustrated.

Figure 17:
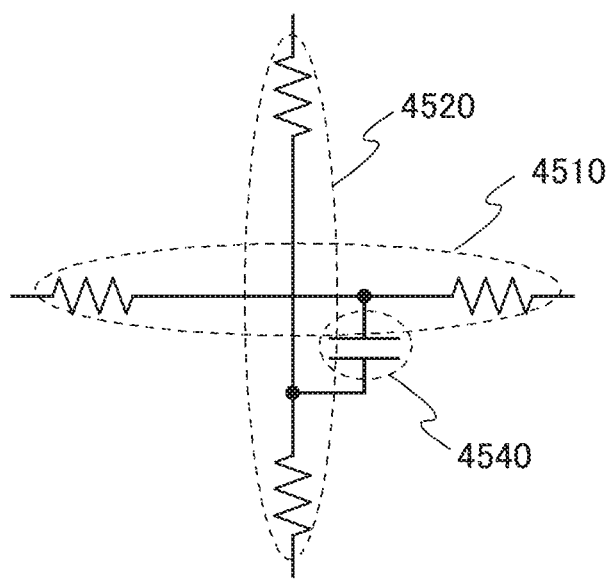
FIG. 17 is a circuit diagram illustrating a touch sensor.

FIG. 17 is an equivalent circuit diagram of an intersection portion of the conductive layer 4510 and the conductive layer 4520. As illustrated in FIG. 17, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 do not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 18:
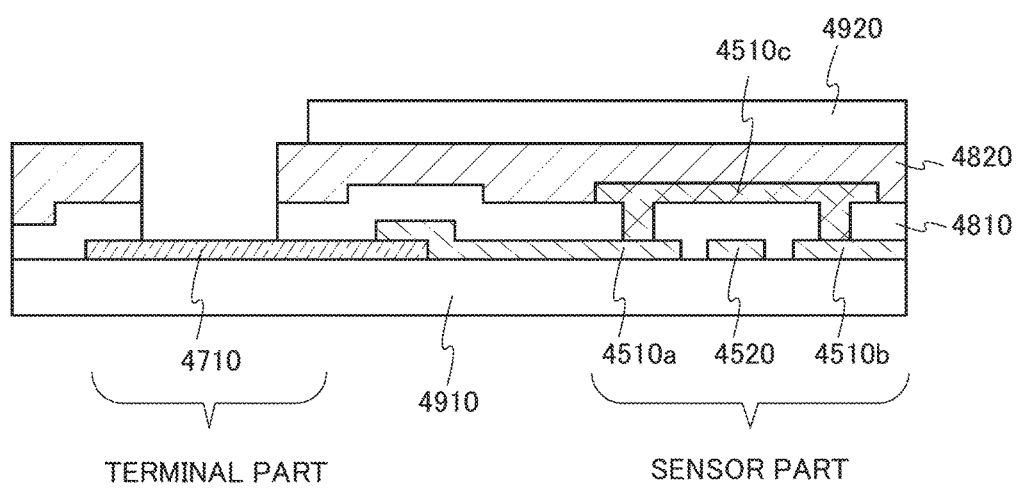
FIG. 18 is a cross-sectional view illustrating a touch sensor.

FIG. 18 is a cross-sectional view illustrating an example of a connection structure between the conductive layers 4510a, 4510b, and 4510c and the conductive layer 4520 of the touch sensor 4500 in FIGS. 16A and 16B. FIG. 18 illustrates, as an example, a cross-sectional view of a portion where the conductive layers 4510 (conductive layers 4510a, 4510b, and 4510c) intersects with the conductive layer 4520.

As illustrated in FIG. 18, the conductive layers 4510 include the conductive layer 4510a and the conductive layer 4510b in the first layer and the conductive layer 4510c in the second layer over an insulating layer 4810. The conductive layer 4510a and the conductive layer 4510b are connected by the conductive layer 4510c. The conductive layer 4520 is formed using the conductive layer in the first layer. An insulating layer 4820 is formed so as to cover the conductive layers 4510 and 4520 and part of a conductive layer 4710. As the insulating layers 4810 and 4820, silicon oxynitride films may be formed, for example. A base film formed using an insulating film may be provided between the substrate 4910 and the conductive layers 4710, 4510a, 4510b, and 4520. As the base film, for example, a silicon oxynitride film can be formed.

The conductive layers 4510a, 4510b, and 4510c and the conductive layer 4520 are formed using a conductive material that transmits visible light, such as indium tin oxide containing silicon oxide, indium tin oxide, zinc oxide, indium zinc oxide, or zinc oxide to which gallium is added.

The conductive layer 4510a is connected to the conductive layer 4710. A terminal for connection to an FPC is formed using the conductive layer 4710. The conductive layer 4520 is connected to the conductive layer 4710 like the conductive layer 4510a. The conductive layer 4710 can be formed of, for example, a tungsten film.

The insulating layer 4820 is formed so as to cover the conductive layers 4510 and 4520 and the conductive layer 4710. An opening is formed in the insulating layers 4810 and 4820 over the conductive layer 4710 so that the conductive layer 4710 is electrically connected to the FPC. A substrate 4920 is attached to the insulating layer 4820 using an adhesive, an adhesive film, or the like. The substrate 4910 side is bonded to a color filter substrate of a display panel with an adhesive or an adhesive film, so that a touch panel is completed.

Next, a module that can be formed using a light-emitting device of one embodiment of the present invention is described with reference to FIG. 19.

Figure 19:
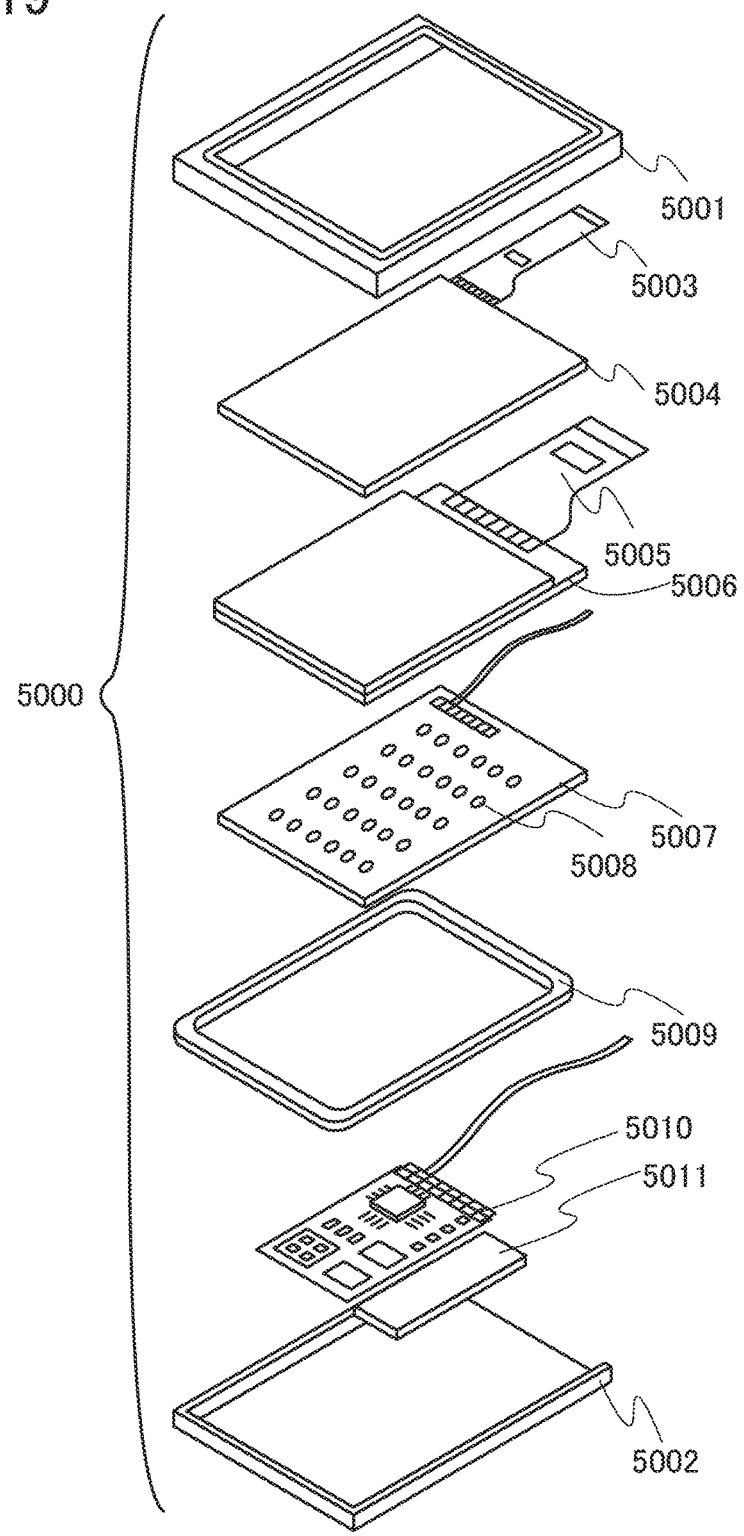
FIG. 19 illustrates a module using a light-emitting device of one embodiment of the present invention.

In a module 5000 in FIG. 19, a touch panel 5004 connected to an FPC 5003, a display panel 5006 connected to an FPC 5005, a backlight unit 5007, a frame 5009, a printed board 5010, and a battery 5011 are provided between an upper cover 5001 and a lower cover 5002. As the backlight unit 5007, the light-emitting device described in Embodiment 7 or the like can be used, for example.

The shapes and sizes of the upper cover 5001 and the lower cover 5002 can be changed as appropriate in accordance with the sizes of the touch panel 5004 and the display panel 5006.

The touch panel 5004 can be a resistive touch panel or a capacitive touch panel and may be formed so as to overlap with the display panel 5006. A counter substrate (sealing substrate) of the display panel 5006 can have a touch panel function. A photosensor may be provided in each pixel of the display panel 5006 so that the touch panel 5004 can function as an optical touch panel.

The backlight unit 5007 includes a light source 5008. Note that although a structure in which the light sources 5008 are placed over the backlight unit 5007 is illustrated in FIG. 19, one embodiment of the present invention is not limited to this structure. For example, a structure in which a light source 5008 is placed at an end portion of the backlight unit 5007 and a light diffusion plate is used may be employed.

The frame 5009 protects the display panel 5006 and functions as an electromagnetic shield for blocking electromagnetic waves generated by the operation of the printed board 5010. The frame 5009 may function as a radiator plate.

The printed board 5010 is provided with a power supply circuit and a signal processing circuit for outputting a video signal and a clock signal. As a power source for supplying power to the power supply circuit, an external commercial power source or a power source using the battery 5011 provided separately may be used. The battery 5011 can be omitted in the case of using a commercial power source. The battery 5011 can be omitted in the case of using a commercial power source.

The module 5000 can be additionally provided with a member such as a polarizing plate, a retardation plate, or a prism sheet.

Note that the structures and the like described in this embodiment can be combined as appropriate with any of the structures described in the other embodiments and the examples.

Embodiment 9

In this embodiment, a structure of the light-emitting element of one embodiment of the present invention is described with reference to FIGS. 20A and 20B.

Figure 20A:
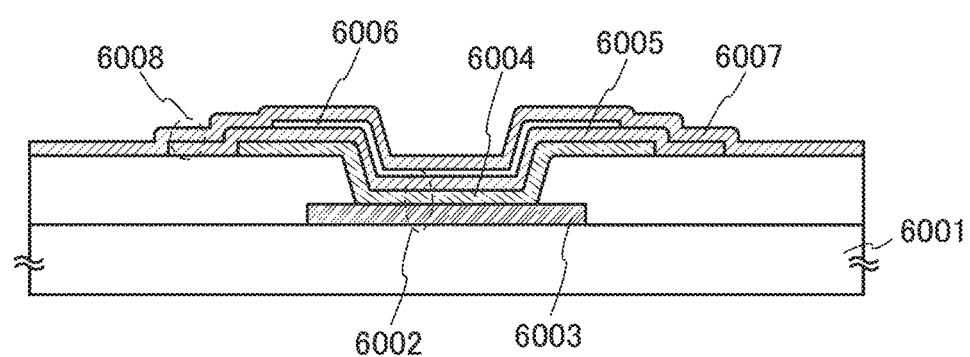
FIGS. 20A and 20B each illustrate a light-emitting element of one embodiment of the present invention.

A light-emitting element 6002 illustrated in FIG. 20A is formed over a substrate 6001. The light-emitting element 6002 includes a first electrode 6003, an EL layer 6004, and a second electrode 6005. Note that the EL layer includes at least two EL layers and an intermediate layer between the EL layers. In a light-emitting device illustrated in FIG. 20A, a buffer layer 6006 is formed over the second electrode 6005, and a third electrode 6007 is formed over the buffer layer 6006. The buffer layer 6006 can prevent a decrease in light-extraction efficiency due to surface plasmon on a surface of the second electrode 6005.

Note that the second electrode 6005 and the third electrode 6007 are electrically connected to each other in a contact portion 6008. The position of the contact portion 6008 is not limited to the position in the drawing, and may be formed in a light-emitting region The first electrode 6003 functions as a cathode and the second electrode 6005 functions as an anode. Light can be extracted as long as at least one of the electrodes has a light-transmitting property, but the both may be formed with a light-transmitting material. In the case where the first electrode 6003 has a function of transmitting light from the EL layer 6004, a transparent conductive film such as ITO can be used. In the case where the first electrode 6003 blocks light from the EL layer 6004, a conductive film formed by stacking a plurality of layers (e.g., ITO and silver) can be used.

In a structure in which light from the EL layer 6004 is extracted from the first electrode 6003 side, the thickness of the second electrode 6005 is preferably smaller than the thickness of the third electrode 6007. In a structure in which the light is extracted from the opposite side, the thickness of the second electrode 6005 is preferably larger than the thickness of the third electrode 6007. However, the thickness is not limited thereto.

For the buffer layer 6006, an organic film (e.g., Alq), an inorganic insulating material (e.g., a silicon nitride film), or the like can be used.

Figure 20B:
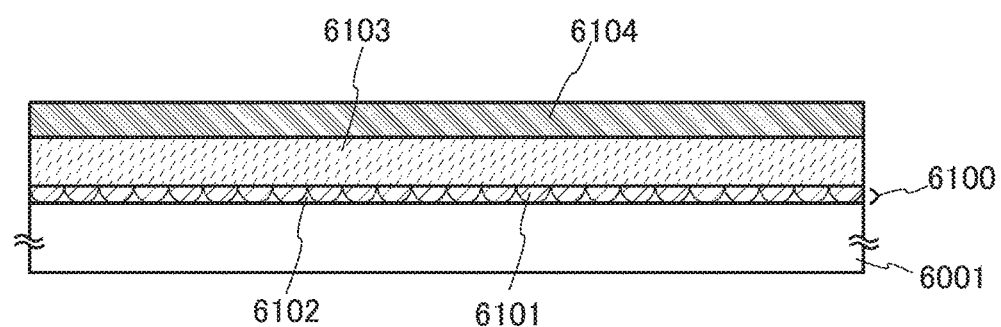

The light-extraction efficiency may be improved by employing a structure illustrated in FIG. 20B as a structure including the light-emitting element of one embodiment of the present invention.

In the structure illustrated in FIG. 20B, a light scattering layer 6100 including a light scatterer 6101 and an air layer 6102 is formed in contact with the substrate 6001; a high refractive index layer 6103 formed with an organic resin is formed in contact with the light scattering layer 6100; and an element layer 6104 including a light-emitting element and the like is formed in contact with the high refractive index layer 6103.

For the light scatterer 6101, particles such as ceramic particles can be used. For the high refractive index layer 6103, a high refractive index (e.g., refractive index greater than or equal to 1.7 and less than or equal to 1.8) material such as polyethylene naphthalate (PEN) can be used.

The element layer 6104 includes the inverted-structure light-emitting element described in Embodiment 1.

Example 1

An inverted-structure tandem light-emitting element according to one embodiment of the present invention is described.

Structural formulae and abbreviations of materials used in this example are shown below. The element structure is similar to that illustrated in FIG. 1.

(i)

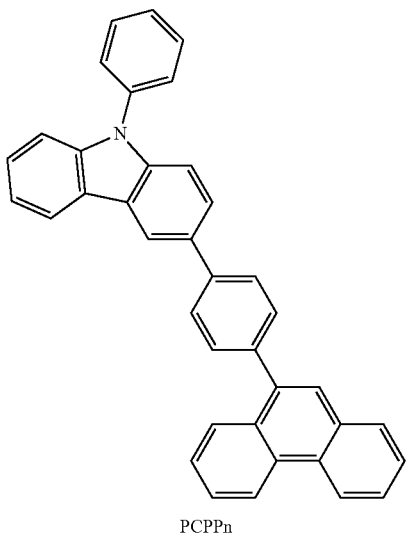

PCPPn

-continued (iii)

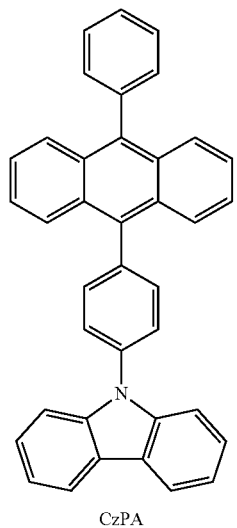

CzPA (iv)

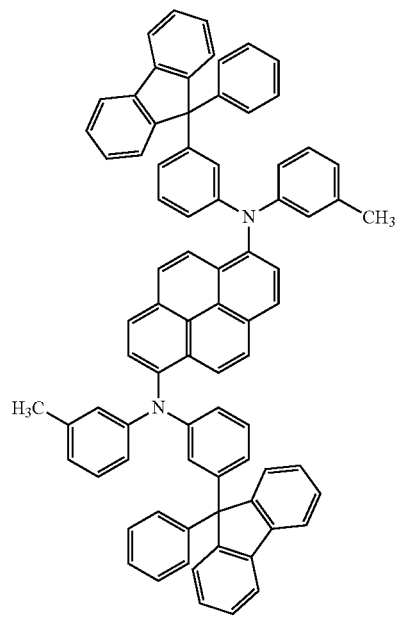

1,6mMemFLPAPrn (v)

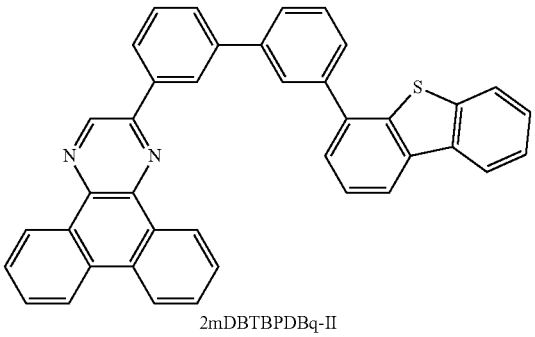

2mDBTBPDBq-II

-continued

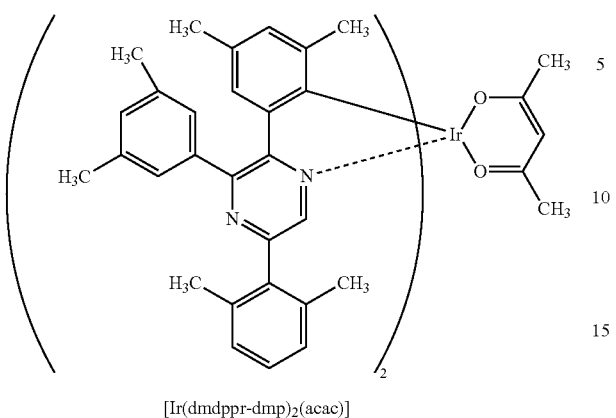

[Ir(dmdppr-dmp)₂(acac)]

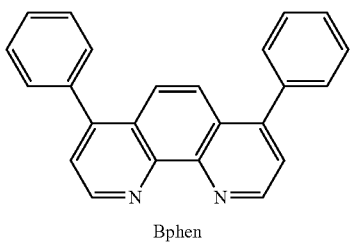

Bphen

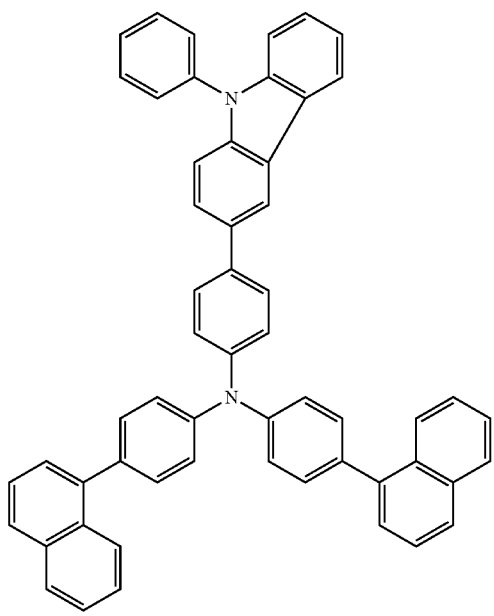

PCBNBB

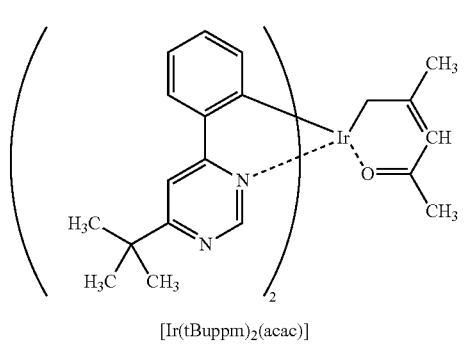

[Ir(tBuppm)₂(acac)]

-continued

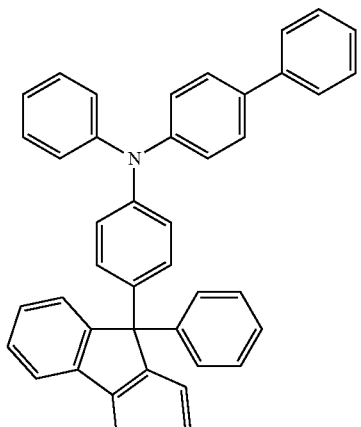

BPAFLP

<<Fabrication of Light-Emitting Element 1>>

First, a glass substrate was prepared.

Over the glass substrate, an aluminum-nickel alloy film containing lanthanum (Al—Ni—La) was formed to a thickness of 200 nm by a sputtering method, and a titanium film was then formed to a thickness of 6 nm by a sputtering method. Then, after heat treatment was performed in a nitrogen atmosphere at 250° C. for one hour, an indium tin oxide film containing silicon oxide (ITSO) was formed to a thickness of 10 nm by a sputtering method. Thus, the cathode 101 was formed. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then a UV ozone treatment was performed for 370 seconds.

Next, the substrate was fixed to a holder provided in the vacuum evaporation apparatus so that the surface of the substrate over which the ITSO film was formed faced downward. After that, the pressure inside the vacuum evaporation apparatus was reduced to approximately $10^{-4}$ Pa, vacuum baking at 170° C. for 30 minutes was performed in a heating chamber of the vacuum evaporation apparatus, and then the substrate was cooled down for approximately 30 minutes.

After the substrate was cooled, 3-[4-(9-phenanthryl)-phenyl]-9-phenyl-9H-carbazole (abbreviation: PCPPn) represented by the above structural formula (i) and molybdenum oxide were co-evaporated such that the weight ratio of PCPPn to molybdenum oxide was 1:0.5. The thickness was set to 5 nm. Next, after copper phthalocyanine (abbreviation: CuPc) was deposited by evaporation to a thickness of 2 nm, bathophenanthroline (abbreviation: Bphen) represented by the above structural formula (ii) was deposited by evaporation to a thickness of 5 nm, lithium oxide (Li₂O) was deposited by evaporation to a thickness of 0.15 nm, and then bathophenanthroline (abbreviation: Bphen) was deposited by evaporation to a thickness of 10 nm. Thus, the electron-injection layer 102a was formed.

Next, 9-[4-(N-carbazolyl)]phenyl-10-phenylanthracene (abbreviation: CzPA) represented by the above structural formula (iii) was deposited to a thickness of 5 nm, thereby forming the electron-transport layer 102b.

Furthermore, N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by the above structural formula (iv) and CzPA (abbreviation) were co-evaporated to a thickness of 20 nm at a weight ratio of 1:0.05 (=CzPA:1,6mMemFLPAPrn), thereby forming a fluorescent layer (first light-emitting layer 102c).

Next, over the light-emitting layer 102c, 3-[4-(9-phenanthryl)-phenyl]-9-phenyl-9H-carbazole (abbreviation: PCPPn) was deposited to a thickness of 15 nm, thereby forming the hole-transport layer 102d. The components including the electron-injection layer 102a to the hole-transport layer 102d function as the first EL layer 102.

Next, the intermediate layer 103 was formed over the first EL layer 102. First, PCPPn and molybdenum oxide were co-evaporated such that the weight ratio of PCPPn to molybdenum oxide was 1:0.5, thereby forming the charge generation layer 103a. The thickness was set to 10 nm. Next, copper phthalocyanine (abbreviation: CuPc) was evaporated to a thickness of 2 nm, thereby forming the electron-relay layer 103b. Then, over the electron-relay layer 103b, bathophenanthroline (abbreviation: Bphen) was evaporated to a thickness of 5 nm, thereby forming the layer 103c. Furthermore, over the layer 103c, lithium oxide ($Li_2O$) was deposited by evaporation to a thickness of 1.5 nm and then bathophenanthroline (abbreviation: Bphen) was evaporated to a thickness of 10 nm, thereby forming the electron-injection buffer layer 103d. The components including the charge generation layer 103a to the electron-injection buffer layer 103d function as the intermediate layer 103.

When evaporation during the formation of the electron-injection buffer layer 103d allows lithium oxide to reach the surface on which the electron-injection buffer layer 103d is formed, Li is diffused into the layer thereunder. However, the layer 103c suppresses entry of Li into the electron-relay layer 103b and the charge generation layer 103a. The diffusion of Li increases drive voltage and decreases emission efficiency in the case of a simple inverted-structure tandem light-emitting element. The layer 103c achieved the inverted-structure tandem light-emitting element whose performance was prevented from being degraded.

The second EL layer 104 was formed over the intermediate layer 103. First, over the electron-injection buffer layer 103d, 2-[3'-(dibenzothiophen-4-yl)biphenyl-3-yl]dibenzo[f,h]quinoxaline (abbreviation: 2mDBTBPDBq-II) represented by the above structural formula (v) was deposited to a thickness of 10 nm, thereby forming the electron-transport layer 104a.

Over the electron-transport layer 104a, a first phosphorescent layer (second light-emitting layer 104b-1) was formed in such a manner that 2mDBTBPDBq-II and bis{4,6-dimethyl-2-[5-(2,6-dimethylphenyl)-3-(3,5-dimethylphenyl)-2-pyrazinyl-κN]phenyl-κC}(2,4-pentanedionato-$κ^2O,O'$)iridium(III) (abbreviation: [Ir(dmdppr-dmp)$_2$(acac)]) represented by the above structural formula (vi) were co-evaporated to a thickness of 20 nm such that the weight ratio was 0.8:0.06 (=2mDBTBPDBq-II:[Ir(dmdppr-dmp)$_2$(acac)]). A second phosphorescent layer (second light-emitting layer 104b-2) was successively formed in such a manner that 2mDBTBPDBq-II, 4,4'-di(1-naphthyl)-4"-(9-phenyl-9H-carbazol-3-yl)triphenylamine (abbreviation: PCBNBB) represented by the above structural formula (vii), and bis[2-(6-tert-butyl-4-pyrimidinyl-κN3)phenyl-κC](2,4-pentanedionato-$κ^2O,O'$)iridium(III) (abbreviation: [Ir(tBuppm)$_2$(acac)]) represented by above structural formula (viii) were co-evaporated to a thickness of 20 nm such that the weight ratio was 0.7:0.3:0.06 (=2mDBTBPDBq-II:PCBNBB:[Ir(tBuppm)$_2$(acac)]). Thus, a phosphorescent layer (second light-emitting layer 104b) was formed.

Over the second light-emitting layer 104b, 4-phenyl-4'-(9-phenylfluoren-9-yl)triphenylamine (abbreviation: BPAFLP) represented by the above structural formula (ix) was deposited to a thickness of 20 nm, thereby forming the hole-transport layer 104c.

Over the hole-transport layer 104c, PCPPn and molybdenum oxide were co-evaporated to a thickness of 30 nm such that the weight ratio of PCPPn to molybdenum oxide was 1:0.5, thereby forming the hole-injection layer 104d.

The components including the electron-transport layer 104a to the hole-injection layer 104d function as the second EL layer 104.

Next, over the second EL layer 104, aluminum was first evaporated to a thickness of 0.5 nm, MgAg (an Mg—Ag alloy) was then co-evaporated to a thickness of 14 nm at a weight ratio of 0.5:0.05 (=Ag:Mg), and indium tin oxide (ITO) was further deposited to a thickness of 70 nm by a sputtering method. Thus, the anode 105 was formed.

The light-emitting element 1 was completed with the cathode 101, the first EL layer 102, the intermediate layer 103, the second EL layer 104, and the anode 105. Note that in all the examples in this specification, evaporation was performed by a resistance-heating method.

<<Fabrication of Light-Emitting Element 2>>

A light-emitting element 2 was formed in the same manner as the light-emitting element 1 except for the intermediate layer. To form the intermediate layer, PCPPn and molybdenum oxide were first co-evaporated over the first EL layer such that the weight ratio of PCPPn to molybdenum oxide was 1:0.5, thereby forming the charge generation layer 103a. Next, bathophenanthroline (abbreviation: Bphen) was evaporated to a thickness of 5 nm, thereby forming the layer 103c suppressing diffusion of alkali metal or alkaline earth metal. Next, lithium oxide ($Li_2O$) was evaporated to a thickness of 1.5 nm and then bathophenanthroline (abbreviation: Bphen) was evaporated to a thickness of 10 nm, thereby forming the electron-injection buffer layer 103d.

The structure except for the intermediate layer is the same as that of the light-emitting element 1, and repetition of the description thereof is omitted. Refer to the method of fabricating the light-emitting element 1.

As described above, the light-emitting element 2 was completed. The difference between the light-emitting elements 1 and 2 is the presence of the electron-relay layer 103b.

<<Fabrication of Comparison Light-Emitting Element 1>>

A comparison light-emitting element 1 was formed in the same manner as the light-emitting element 1 except for the intermediate layer. To form the intermediate layer, PCPPn and molybdenum oxide were first co-evaporated over the first EL layer such that the weight ratio of PCPPn to molybdenum oxide was 1:0.5, thereby forming the charge generation layer 103a. Next, copper phthalocyanine (abbreviation: CuPc) was evaporated to a thickness of 2 nm, thereby forming the electron-relay layer 103c. Next, lithium oxide ($Li_2O$) was deposited by evaporation to a thickness of 1.5 nm and then bathophenanthroline (abbreviation: Bphen) was evaporated to a thickness of 10 nm, thereby forming the electron-injection buffer layer 103d.

The structure except for the intermediate layer is the same as that of the light-emitting element 1, and repetition of the description thereof is omitted. Refer to the method of fabricating the light-emitting element 1.

As described above, the comparison light-emitting element 1 was completed. The difference between the comparison light-emitting element 1 and the light-emitting element 1 is the presence of the layer 103c suppressing diffusion of alkali metal or alkaline earth metal. The following Table 1 summarizes stacked layer structures of the comparison light-emitting element 1 and the light-emitting elements 1 and 2.

TABLE 1

|  | Light-emitting element 1 | Light-emitting element 2 | Comparison light-emitting element 1 |
|---|---|---|---|
| Cathode 101 | Al—Ni—La\Ti (200 nm\6 nm) | | |
| | ITSO (10 nm) | | |
| Electron-injection layer 102a | PCPPn:MoOx (1:0.5, 5 nm) | | |
| | CuPc (2 nm) | | |
| | Bphen (5 nm) | | |
| | Li$_2$O (0.15 nm) | | |
| | Bphen (10 nm) | | |
| Electron-transport layer 102b | CzPA (5 nm) | | |
| Light-emitting layer 102c | CzPA:1,6mMemFLPAPrn (1:0.05, 20 nm) | | |
| Hole-transport layer 102d | PCPPn (15 nm) | | |
| Charge generation layer 103a | PCPPn:MoOx (1:0.5, 10 nm) | | |
| Electron relay layer 103b | CuPc (2 nm) | — | CuPc (2 nm) |
| Layer 103c | Bphen (5 nm) | | — |
| Electron-injection buffer layer 103d | Li$_2$O (1.5 nm) | | |
| | Bphen (10 nm) | | |
| Electron-transport layer 104a | 2mDBTBPDBq-II (10 nm) | | |
| Light-emitting layer 104b | 2mDBTBPDBq-II:[Ir(dmdppr-dmp)$_2$(acac)] | | |
| | (0.8:0.06, 20 nm) | | |
| | 2mDBTBPDBq-II:PCBNBB:[Ir(tBuppm)$_2$(acac)] | | |
| | (0.7:0.3:0.06, 20 nm) | | |
| Hole-transport layer 104c | BPAFLP (20 nm) | | |
| Hole-injection layer 104d | PCPPn:MoOx (1:0.5, 30 nm) | | |
| Anode 105 | Al (0.5 nm) | | |
| | Ag:Mg (0.5:0.05, 14 nm) | | |
| | ITO (70 nm) | | |

<<Operation Characteristics of Light-Emitting Elements 1 and 2>>

In a glove box under a nitrogen atmosphere, the light-emitting elements 1 and 2 obtained as described above were sealed so as not to be exposed to the air (specifically, a sealant was applied onto an outer edge of each element, and heat treatment at 80° C. for 1 hour and UV treatment were performed). Then, the operation characteristics of the light-emitting elements 1 and 2 were measured. Note that the measurements were carried out at room temperature (in an atmosphere kept at 25° C.).

Figure 7:
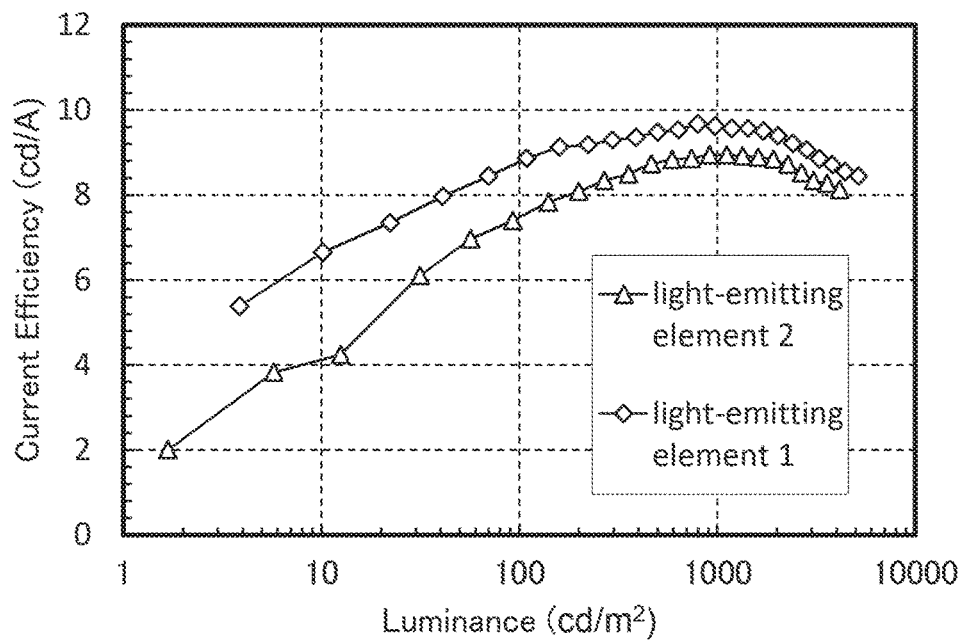
FIG. 7 shows luminance versus current efficiency characteristics of light-emitting elements 1 and 2.
Figure 8:
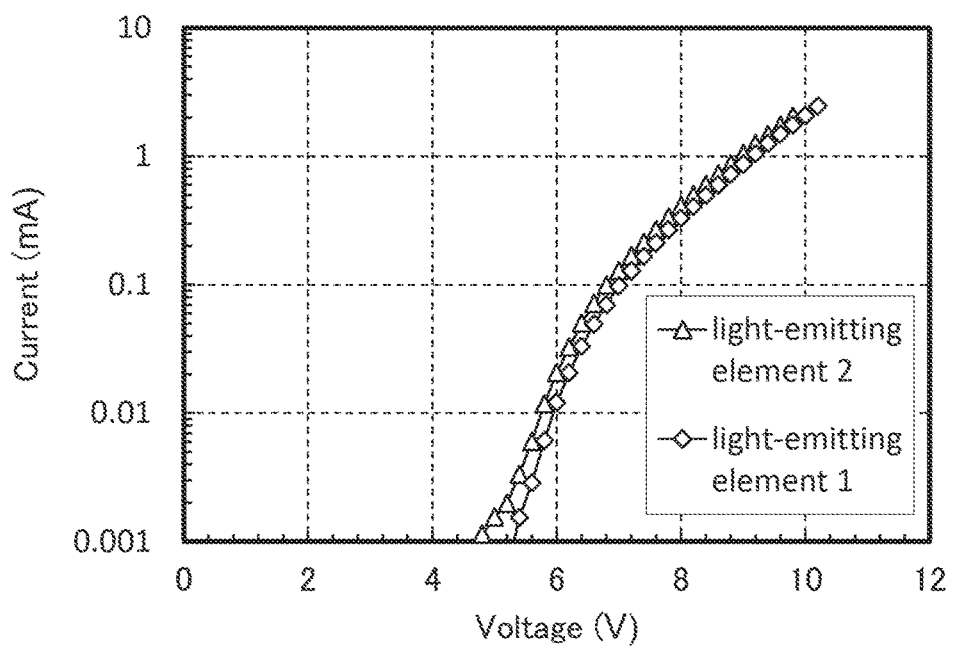
FIG. 8 shows voltage versus current characteristics of the light-emitting elements 1 and 2.

FIG. 7 shows luminance versus current efficiency characteristics of the light-emitting elements 1 and 2, and FIG. 8 shows voltage versus current characteristics thereof. In FIG. 7, the vertical axis represents current efficiency (cd/A) and the horizontal axis represents luminance (cd/m$^2$). In FIG. 8, the vertical axis represents current (mA) and the horizontal axis represents voltage (V). Table 2 lists the values of the main characteristics. Note that the light-emitting elements 1 and 2 emitted blue light because the thickness of the ITSO (Si-containing ITO) layer of the cathode 101 affected microcavity effects in the light-emitting elements 1 and 2. The thickness of the ITSO layer was set on the assumption that the inverted-structure tandem light-emitting element was used for a blue pixel in a display panel.

TABLE 2

|  | Light-emitting element 1 | Light-emitting element 2 |
|---|---|---|
| Voltage (V) | 8.2 | 8.0 |
| Current (mA) | 0.41 | 0.41 |
| Current density (mA/cm$^2$) | 10.1 | 10.2 |
| Chromaticity coordinates (x, y) | (0.15, 0.16) | (0.15, 0.15) |
| Luminance (cd/m$^2$) | 976 | 916 |
| Current efficiency (cd/A) | 9.6 | 8.9 |
| Power efficiency (lm/W) | 3.7 | 3.5 |

<<Operation Characteristics of Comparison Light-Emitting Element 1>>

In a glove box under a nitrogen atmosphere, the comparison light-emitting element 1 obtained as described above was sealed so as not to be exposed to the air (specifically, a sealant was applied onto an outer edge of each element, and heat treatment at 80° C. for 1 hour and UV treatment were performed). Then, an attempt was made to measure the operation characteristics of the comparison light-emitting element 1. Note that the measurements were attempted at room temperature (in an atmosphere kept at 25° C.).

In the measurements of the operation characteristics, the comparison light-emitting element 1 did not even emit light and the characteristics failed to be measured. The comparison light-emitting element 1 is considered to have been unable to emit light because it does not have the layer 103c and part of lithium in the material of the electron-injection buffer layer 103d moved toward the cathode and reached the charge generation layer 103a to cause carrier recombination. The inverted-structure tandem light-emitting element which includes the layer 103c can emit light while enjoying the advantages of the tandem structure and the inverted structure because of the layer 103c.

Both the light-emitting elements 1 and 2 emitted light because they include the layer 103c. Since the light-emitting element 1 includes the electron-relay layer 103b formed by evaporation of copper phthalocyanine (abbreviation: CuPc), luminance, current efficiency, and power efficiency can further be improved as compared to the light-emitting element 2.

Example 2

An inverted-structure tandem light-emitting element according to one embodiment of the present invention is described.

Because the materials used in this example are used in Example 1, the chemical structural formulae thereof are omitted here. The element structure is similar to that illustrated in FIG. 1.

<<Fabrication of Light-Emitting Element 3>>

First, a glass substrate was prepared.

Over the glass substrate, an aluminum-nickel alloy film containing lanthanum (Al—Ni—La) was formed to a thickness of 200 nm by a sputtering method, and a titanium film was then formed to a thickness of 6 nm by a sputtering method. Then, after heat treatment was performed in a nitrogen atmosphere at 250° C. for one hour, a 40-nm-thick indium tin oxide film containing silicon oxide (ITSO) was formed by a sputtering method. Thus, the cathode 101 was formed. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then a UV ozone treatment was performed for 370 seconds.

Next, the substrate was fixed to a holder provided in the vacuum evaporation apparatus so that the surface of the substrate over which the ITSO film was formed faced downward. After that, the pressure inside the vacuum evaporation apparatus was reduced to approximately $10^{-4}$ Pa, vacuum baking at 170° C. for 30 minutes was performed in a heating chamber of the vacuum evaporation apparatus, and then the substrate was cooled down for approximately 30 minutes.

After the substrate was cooled, 3-[4-(9-phenanthryl)-phenyl]-9-phenyl-9H-carbazole (abbreviation: PCPPn) and molybdenum oxide were co-evaporated such that the weight ratio of PCPPn to molybdenum oxide was 1:0.5. The thickness was set to 15 nm. Next, after copper phthalocyanine (abbreviation: CuPc) was evaporated to a thickness of 2 nm, bathophenanthroline (abbreviation: Bphen) was deposited by evaporation to a thickness of 5 nm, lithium oxide ($Li_2O$) was deposited by evaporation to a thickness of 0.15 nm, and then bathophenanthroline (abbreviation: Bphen) was deposited by evaporation to a thickness of 10 nm. Thus, the electron-injection layer 102a was formed.

Next, 9-[4-(N-carbazolyl)]phenyl-10-phenylanthracene (abbreviation: CzPA) was evaporated to a thickness of 5 nm, thereby forming the electron-transport layer 102b.

Furthermore, N,N'-bis(3-methylphenyl)-N,N'-bis[3-(9-phenyl-9H-fluoren-9-yl)phenyl]-pyrene-1,6-diamine (abbreviation: 1,6mMemFLPAPrn) and CzPA (abbreviation) were co-evaporated to a thickness of 25 nm at a weight ratio of 1:0.05 (=CzPA:1,6mMemFLPAPrn), thereby forming a fluorescent layer (first light-emitting layer 102c).

Next, over the light-emitting layer 102c, a 3-[4-(9-phenanthryl)-phenyl]-9-phenyl-9H-carbazole (abbreviation: PCPPn) was deposited to a thickness of 15 nm, thereby forming the hole-transport layer 102d. The components including the electron-injection layer 102a to the hole-transport layer 102d function as the first EL layer 102.

Next, the intermediate layer 103 was formed over the first EL layer 102. First, PCPPn and molybdenum oxide were co-evaporated such that the weight ratio of PCPPn to molybdenum oxide was 1:0.5, thereby forming the charge generation layer 103a. The thickness was set to 10 nm. Next, copper phthalocyanine (abbreviation: CuPc) was evaporated to a thickness of 2 nm, thereby forming the electron-relay layer 103b. Then, over the electron-relay layer 103b, bathophenanthroline (abbreviation: Bphen) was evaporated to a thickness of 5 nm, thereby forming the layer 103c. Furthermore, over the layer 103c, calcium (Ca), which is an alkaline earth metal, was evaporated to a thickness of 1 nm and then bathophenanthroline (abbreviation: Bphen) was evaporated to a thickness of 10 nm, thereby forming the electron-injection buffer layer 103d. The components including the charge generation layer 103a to the electron-injection buffer layer 103d function as the intermediate layer.

When evaporation during the formation of the electron-injection buffer layer 103d allows calcium (Ca) to reach the surface on which the electron-injection buffer layer 103d is formed, Ca is diffused into the layer thereunder. However, the layer 103c suppresses entry of Ca into the electron-relay layer 103b and the charge generation layer 103a. The diffusion of Ca decreases current efficiency and external quantum efficiency in the case of a simple inverted-structure tandem light-emitting element. The layer 103c achieves the inverted-structure tandem light-emitting element whose performance is prevented from being degraded.

The second EL layer 104 was formed over the intermediate layer 103. First, over the electron-injection buffer layer 103d, 2-[3'-(dibenzothiophen-4-yl)biphenyl-3-yl]dibenzo[f,h]quinoxaline (abbreviation: 2mDBTBPDBq-II) was deposited to a thickness of 10 nm, thereby forming the electron-transport layer 104a.

Next, over the electron-transport layer 104a, a first phosphorescent layer (second light-emitting layer 104b-1) was formed in such a manner that 2mDBTBPDBq-II and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium(III) (abbreviation: [Ir(dmdppr-dmp)$_2$(acac)]) were co-evaporated to a thickness of 20 nm such that the weight ratio was 0.8:0.06 (=2mDBTBPDBq-II:[Ir(dmdppr-dmp)$_2$(acac)]). A second phosphorescent layer (second light-emitting layer 104b-2) was successively formed in such a manner that 2mDBTBPDBq-II, 4,4'-di(1-naphthyl)-4"-(9-phenyl-9H-carbazol-3-yl)triphenylamine (abbreviation: PCBNBB), and bis[2-(6-tert-butyl-4-pyrimidinyl-N3)phenyl-κC](2,4-pentanedionato-κ$^2$O,O')iridium(III) (abbreviation: [Ir(tBuppm)$_2$(acac)]) were co-evaporated to a thickness of 20 nm such that the weight ratio was 0.7:0.3:0.06 (=2mDBTBPDBq-II:PCBNBB:[Ir(tBuppm)$_2$(acac)]). Thus, a phosphorescent layer (second light-emitting layer 104b) was formed.

Over the second light-emitting layer 104b, 4-phenyl-4'-(9-phenylfluoren-9-yl)triphenylamine (abbreviation: BPAFLP) was deposited to a thickness of 20 nm, thereby forming the hole-transport layer 104c.

Over the hole-transport layer 104c, PCPPn and molybdenum oxide were co-evaporated to a thickness of 25 nm such that the weight ratio of PCPPn to molybdenum oxide was 1:0.5, thereby forming the hole-injection layer 104d.

The components including the electron-transport layer 104a to the hole-injection layer 104d function as the second EL layer 104.

Next, over the second EL layer 104, aluminum was first evaporated to a thickness of 0.5 nm, MgAg (an Mg—Ag alloy) was then co-evaporated to a thickness of 15 nm at a weight ratio of 0.5:0.05 (=Ag:Mg), and indium tin oxide (ITO) was further deposited to a thickness of 70 nm by a sputtering method. Thus, the anode 105 was formed.

The light-emitting element 3 was completed with the cathode 101, the first EL layer 102, the intermediate layer 103, the second EL layer 104, and the anode 105.

<<Fabrication of Comparison Light-Emitting Element 2>>

A comparison light-emitting element 2 was formed in the same manner as the light-emitting element 3 except for the intermediate layer. To form the intermediate layer, PCPPn and molybdenum oxide were first evaporated to a thickness of 10 nm, thereby forming the charge generation layer 103a. Next, copper phthalocyanine (abbreviation: CuPc) was evaporated to a thickness of 2 nm, thereby forming the electron-relay layer 103b. Next, calcium (Ca) was deposited by evaporation to a thickness of 1 nm and then bathophenanthroline (abbreviation: Bphen) was evaporated to a thickness of 10 nm, thereby forming the electron-injection buffer layer 103d.

The structure except for the intermediate layer is the same as that of the light-emitting element 3, and repetition of the description thereof is omitted. Refer to the method of fabricating the light-emitting element 3.

As described above, the comparison light-emitting element 2 was completed. The difference between the comparison light-emitting element 2 and the light-emitting element 3 is the presence of the layer 103c suppressing diffusion of alkali metal or alkaline earth metal. The following Table 3 summarizes stacked layer structures of the comparison light-emitting element 2 and the light-emitting element 3.

TABLE 3

| | Light-emitting element 3 | Comparison light-emitting element 2 |
|---|---|---|
| Cathode 101 | | Al—Ni—La\Ti (200 nm\6 nm) |
| | | ITSO (40 nm) |
| Electron-injection layer 102a | | PCPPn:MoOx (1:0.5, 15 nm) |
| | | CuPc (2 nm) |
| | | Bphen (5 nm) |
| | | Li$_2$O (0.15 nm) |
| | | Bphen (10 nm) |
| Electron-transport layer 102b | | CzPA (5 nm) |
| Light-emitting layer 102c | | CzPA:1,6mMemFLPAPrn |
| | | (1:0.05, 25 nm) |
| Hole-transport layer 102d | | PCPPn (15 nm) |
| Charge generation layer 103a | | PCPPn:MoOx (1:0.5, 10 nm) |
| Electron relay layer 103b | | CuPc (2 nm) |
| Layer 103c | Bphen (5 nm) | — |
| Electron-injection buffer layer 103d | | Ca (1 nm) |
| | | Bphen (10 nm) |
| Electron-transport layer 104a | | 2mDBTBPDBq-II (10 nm) |
| Light-emitting layer 104b | | 2mDBTBPDBq-II:[Ir(dmdppr-dmp)$_2$(acac)] |
| | | (0.8:0.06, 20 nm) |
| | | 2mDBTBPDBq-II:PCBNBB:[Ir(tBuppm)$_2$(acac)] |
| | | (0.7:0.3:0.06, 20 nm) |
| Hole-transport layer 104c | | BPAFLP (20 nm) |
| Hole-injection layer 104d | | PCPPn:MoOx (1:0.5, 25 nm) |
| Anode 105 | | Al (0.5 nm) |
| | | Ag:Mg (0.5:0.05, 15 nm) |
| | | ITO (70 nm) |

<<Operation Characteristics of Light-Emitting Element 3 and Comparison Light-Emitting Element 2>>

In a glove box under a nitrogen atmosphere, the light-emitting element 3 and the comparison light-emitting element 2 obtained as described above were sealed so as not to be exposed to the air (specifically, a sealant was applied onto an outer edge of each element, and heat treatment at 80° C. for 1 hour and UV treatment were performed). Then, the operation characteristics of these light-emitting elements were measured. Note that the measurements were carried out at room temperature (in an atmosphere kept at 25° C.).

Figure 9:
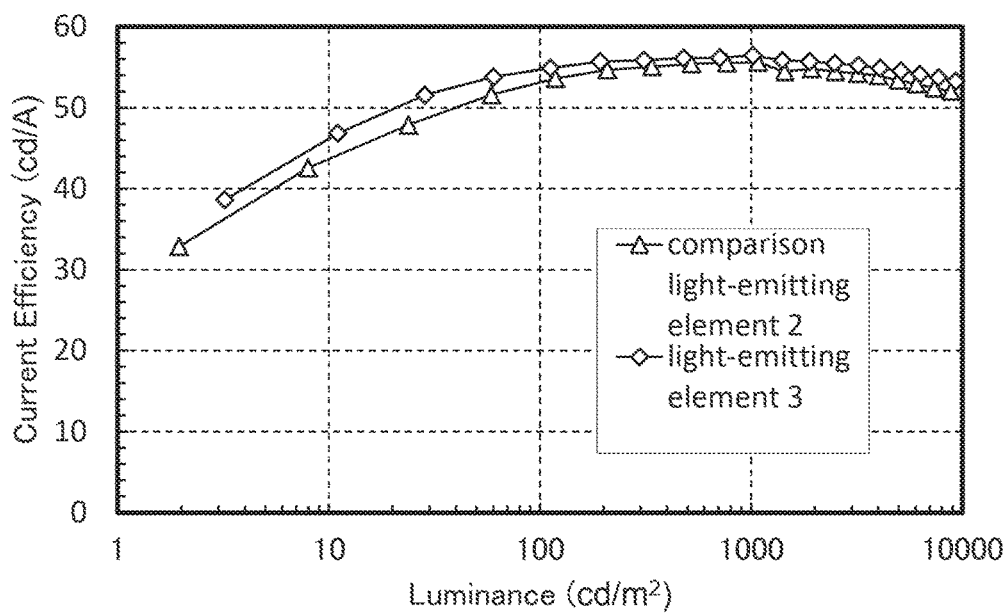
FIG. 9 shows luminance versus current efficiency characteristics of a light-emitting element 3 and a comparison light-emitting element 2.
Figure 10:
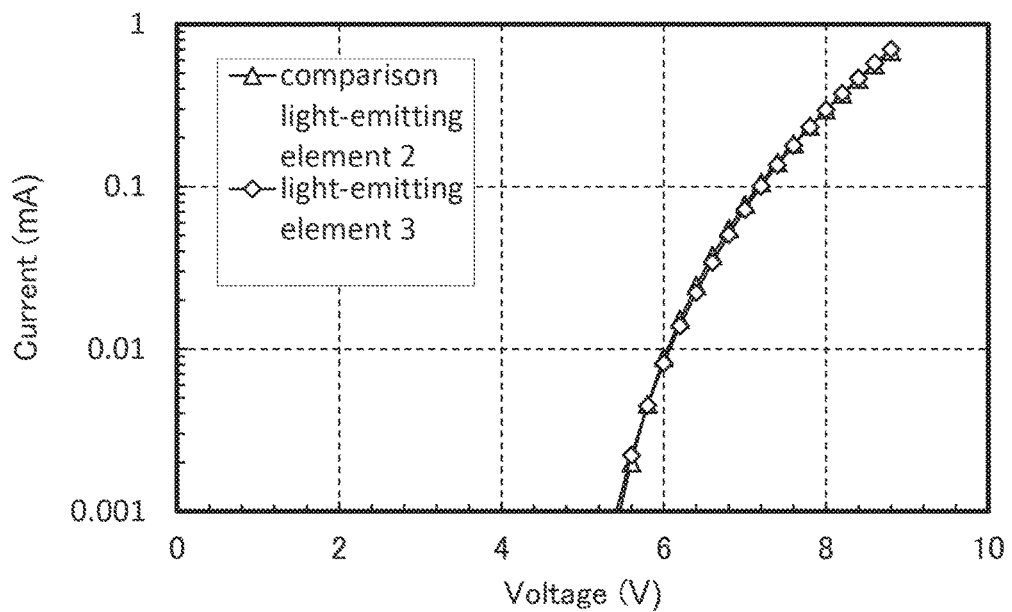
FIG. 10 shows voltage versus current characteristics of the light-emitting element 3 and the comparison light-emitting element 2.

FIG. 9 shows luminance versus current efficiency characteristics of these light-emitting elements, and FIG. 10 shows voltage versus current characteristics thereof. In FIG. 9, the vertical axis represents current efficiency (cd/A) and the horizontal axis represents luminance (cd/m$^2$). In FIG. 10, the vertical axis represents current (mA) and the horizontal axis represents voltage (V). The values of the main characteristics of the light-emitting element 3 and the comparison light-emitting element 2 are shown below. Note that the light-emitting element 3 and the comparison light-emitting element 2 emitted green light because the thickness of the ITSO layer of the cathode 101 affected microcavity effects in the light-emitting element 3 and the comparison light-emitting element 2. The thickness of the ITSO layer was set on the assumption that the inverted-structure tandem light-emitting element was used for a green pixel in a display panel.

TABLE 4

| | Light-emitting element 3 | Comparison light-emitting element 2 |
|---|---|---|
| Voltage (V) | 7.0 | 8.2 |
| Current (mA) | 0.072 | 0.078 |
| Current density (mA/cm$^2$) | 1.81 | 1.94 |
| Chromaticity coordinates (x, y) | (0.35, 0.62) | (0.32, 0.65) |
| Luminance (cd/m$^2$) | 1019 | 1078 |

TABLE 4-continued

| | Light-emitting element 3 | Comparison light-emitting element 2 |
|---|---|---|
| Current efficiency (cd/A) | 56 | 56 |
| Power efficiency (lm/W) | 25.3 | 24.9 |

The comparison light-emitting element 2 emitted light unlike the comparison light-emitting element 1. This difference is considered to be ascribed to the difference in the movability of lithium and calcium. However, as apparent from Table 2, the inverted-structure tandem light-emitting element containing calcium in the electron-injection buffer layer also has improved characteristics by including the layer 103c. The above-described results demonstrate the excellent function, as a light-emitting element, of an inverted-structure tandem light-emitting element including the intermediate layer including the layer 103c and an electron-injection buffer layer containing calcium, which is an alkaline earth metal.

Example 3

An inverted-structure tandem light-emitting element according to one embodiment of the present invention is described.

Structural formulae and abbreviations of materials used in this example are shown below. Note that the structural formulae of the materials described in Example 1 are omitted. The element structure is similar to that illustrated in FIG. 1.

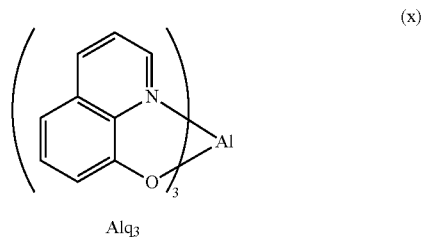

Alq₃ (x)

<Fabrication of Light-Emitting Element 4>>

First, a glass substrate was prepared.

Over the glass substrate, an aluminum-nickel alloy film containing lanthanum (Al—Ni—La) was formed to a thickness of 200 nm by a sputtering method, and a titanium film was then formed to a thickness of 6 nm by a sputtering method. Then, after heat treatment was performed in a nitrogen atmosphere at 250° C. for one hour, a 40-nm-thick indium tin oxide film containing silicon oxide (ITSO) was formed by a sputtering method. Thus, the cathode 101 was formed. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then a UV ozone treatment was performed for 370 seconds.

Next, the substrate was fixed to a holder provided in the vacuum evaporation apparatus so that the surface of the substrate over which the ITSO film was formed faced downward. After that, the pressure inside the vacuum evaporation apparatus was reduced to approximately $10^{-4}$ Pa, vacuum baking at 170° C. for 30 minutes was performed in a heating chamber of the vacuum evaporation apparatus, and then the substrate was cooled down for approximately 30 minutes.

After the substrate was cooled, 3-[4-(9-phenanthryl)-phenyl]-9-phenyl-9H-carbazole (abbreviation: PCPPn) and molybdenum oxide were co-evaporated such that the weight ratio of PCPPn to molybdenum oxide was 1:0.5. The thickness was set to 15 nm. Next, after copper phthalocyanine (abbreviation: CuPc) was evaporated to a thickness of 2 nm, bathophenanthroline (abbreviation: Bphen) was deposited by evaporation to a thickness of 5 nm, lithium oxide (Li₂O) was deposited by evaporation to a thickness of 0.15 nm, and then bathophenanthroline (abbreviation: Bphen) was evaporated to a thickness of 10 nm. Thus, the electron-injection layer 102a was formed.

Over the electron-injection layer 102a, 9-[4-(N-carbazolyl)]phenyl-10-phenylanthracene (abbreviation: CzPA) was deposited to a thickness of 5 nm, thereby forming the electron-transport layer 102b.

Over the electron-transport layer 102b, N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by the above structural formula (iv) and CzPA (abbreviation) were co-evaporated to a thickness of 25 nm at a weight ratio of 1:0.05 (=CzPA:1,6mMemFLPAPrn), thereby forming a fluorescent layer (first light-emitting layer 102c).

Next, over the light-emitting layer 102c, 3-[4-(9-phenanthryl)-phenyl]-9-phenyl-9H-carbazole (abbreviation: PCPPn) was deposited to a thickness of 15 nm, thereby forming the hole-transport layer 102d. The components including the electron-injection layer 102a to the hole-transport layer 102d function as the first EL layer 102.

Next, the intermediate layer 103 was formed over the first EL layer 102. First, PCPPn and molybdenum oxide were co-evaporated such that the weight ratio of PCPPn to molybdenum oxide was 1:0.5, thereby forming the charge generation layer 103a. The thickness was set to 10 nm. Next, copper phthalocyanine (abbreviation: CuPc) was evaporated to a thickness of 2 nm, thereby forming the electron-relay layer 103b. Then, over the electron-relay layer 103b, tris(8-quinolinolato)aluminum (abbreviation: Alq₃) represented by the above structural formula (x) was evaporated to a thickness of 5 nm, thereby forming the layer 103c. Furthermore, over the layer 103c, lithium oxide (Li₂O), which is an alkaline earth metal, was evaporated to a thickness of 0.15 nm and then bathophenanthroline (abbreviation: Bphen) was evaporated to a thickness of 10 nm, thereby forming the electron-injection buffer layer 103d. The components including the charge generation layer 103a to the electron-injection buffer layer 103d function as the intermediate layer 103.

When evaporation during the formation of the electron-injection buffer layer 103d allows lithium (Li) to reach the surface on which the electron-injection buffer layer 103d is formed, Li is diffused into the layer thereunder. However, the layer 103c suppresses entry of Li into the electron-relay layer 103b and the charge generation layer 103a. The diffusion of Li increases drive voltage and decreases emission efficiency in the case of a simple inverted-structure tandem light-emitting element. The layer 103c achieved the inverted-structure tandem light-emitting element whose performance was prevented from being degraded.

The second EL layer 104 was formed over the intermediate layer 103. First, over the electron-injection buffer layer 103d, 2-[3'-(dibenzothiophen-4-yl)biphenyl-3-yl]dibenzo[f,h]quinoxaline (abbreviation: 2mDBTBPDBq-II) was deposited to a thickness of 10 nm, thereby forming the electron-transport layer 104a.

Over the electron-transport layer 104a, a first phosphorescent layer (second light-emitting layer 104b-1) was formed in such a manner that 2mDBTBPDBq-II (abbreviation) and bis {4,6-dimethyl-2-[5-(2,6-dimethylphenyl)-3-(3,5-dimethylphenyl)-2-pyrazinyl-κN]phenyl-κC}(2,4-pentanedionato-κ²O,O')iridium(III) (abbreviation: [Ir(dmdppr-dmp)₂(acac)]) were co-evaporated to a thickness of 20 nm such that the weight ratio was 0.8:0.06 (=2mDBTBPDBq-II:[Ir(dmdppr-dmp)₂(acac)]). A second phosphorescent layer (second light-emitting layer 104b-2) was successively formed in such a manner that 2mDBTBPDBq-II (abbreviation), 4,4'-di(1-naphthyl)-4''-(9-phenyl-9H-carbazol-3-yl)triphenylamine (abbreviation: PCBNBB), and bis[2-(6-tert-butyl-4-pyrimidinyl-N3)phenyl-κC](2,4-pentanedionato-κ²O,O')iridium(III) (abbreviation: [Ir(tBuppm)₂(acac)]) were co-evaporated to a thickness of 20 nm such that the weight ratio was 0.7:0.3:0.06 (=2mDBTBPDBq-II:PCBNBB:[Ir(tBuppm)₂(acac)]). Thus, a phosphorescent layer (second light-emitting layer 104b) was formed.

Over the second light-emitting layer 104b, 4-phenyl-4'-(9-phenylfluoren-9-yl)triphenylamine (abbreviation: BPAFLP) was deposited to a thickness of 20 nm, thereby forming the hole-transport layer 104c.

Over the hole-transport layer 104c, PCPPn and molybdenum oxide were co-evaporated to a thickness of 25 nm such that the weight ratio of PCPPn to molybdenum oxide was 1:0.5, thereby forming the hole-injection layer 104d.

The components including the electron-transport layer 104a to the hole-injection layer 104d function as the second EL layer 104.

Next, over the second EL layer 104, aluminum was first evaporated to a thickness of 0.5 nm, MgAg (an Mg—Ag alloy) was then co-evaporated to a thickness of 15 nm at a weight ratio of 0.5:0.05 (=Ag:Mg), and indium tin oxide (ITO) was further deposited to a thickness of 70 nm by a sputtering method. Thus, the anode 105 was formed.

The light-emitting element 4 was completed with the cathode 101, the first EL layer 102, the intermediate layer 103, the second EL layer 104, and the anode 105. The following table summarizes stacked layer structure of the light-emitting element 4.

TABLE 5

| | Light-emitting element 4 |
|---|---|
| Cathode 101 | Al—Ni—La\Ti (200 nm\6 nm) |
| | ITSO (40 nm) |
| Electron-injection layer 102a | PCPPn:MoOx (1:0.5, 15 nm) |
| | CuPc (2 nm) |
| | Bphen (5 nm) |
| | Li$_2$O (0.15 nm) |
| | Bphen (10 nm) |
| Electron-transport layer 102b | CzPA (5 nm) |
| Light-emitting layer 102c | CzPA:1,6mMemFLPAPrn |
| | (1:0.05, 25 nm) |
| Hole-transport layer 102d | PCPPn (15 nm) |
| Charge generation layer 103a | PCPPn:MoOx (1:0.5, 10 nm) |
| Electron relay layer 103b | CuPc (2 nm) |
| Layer 103c | Alq$_3$ (5 nm) |
| Electron-injection buffer layer 103d | Li$_2$O (0.15 nm) |
| | Bphen (10 nm) |
| Electron-transport layer 104a | 2mDBTBPDBq-II (10 nm) |
| Light-emitting layer 104b | 2mDBTBPDBq-II:[Ir(dmdppr-dmp)$_2$(acac)] |
| | (0.8:0.06, 20 nm) |
| | 2mDBTBPDBq-II:PCBNBB:[Ir(tBuppm)$_2$(acac)] |
| | (0.7:0.3:0.06, 20 nm) |
| Hole-transport layer 104c | BPAFLP (20 nm) |
| Hole-injection layer 104d | PCPPn:MoOx (1:0.5, 25 nm) |
| Anode 105 | Al (0.5 nm) |
| | Ag:Mg (0.5:0.05, 15 nm) |
| | ITO (70 nm) |

<<Operation Characteristics of Light-Emitting Element 4>>

In a glove box under a nitrogen atmosphere, the light-emitting element 4 obtained as described above was sealed so as not to be exposed to the air (specifically, a sealant was applied onto an outer edge of each element, and heat treatment at 80° C. for 1 hour and UV treatment were performed). Then, the operation characteristics of the light-emitting element 4 were measured. Note that the measurements were carried out at room temperature (in an atmosphere kept at 25° C.).

Figure 11:
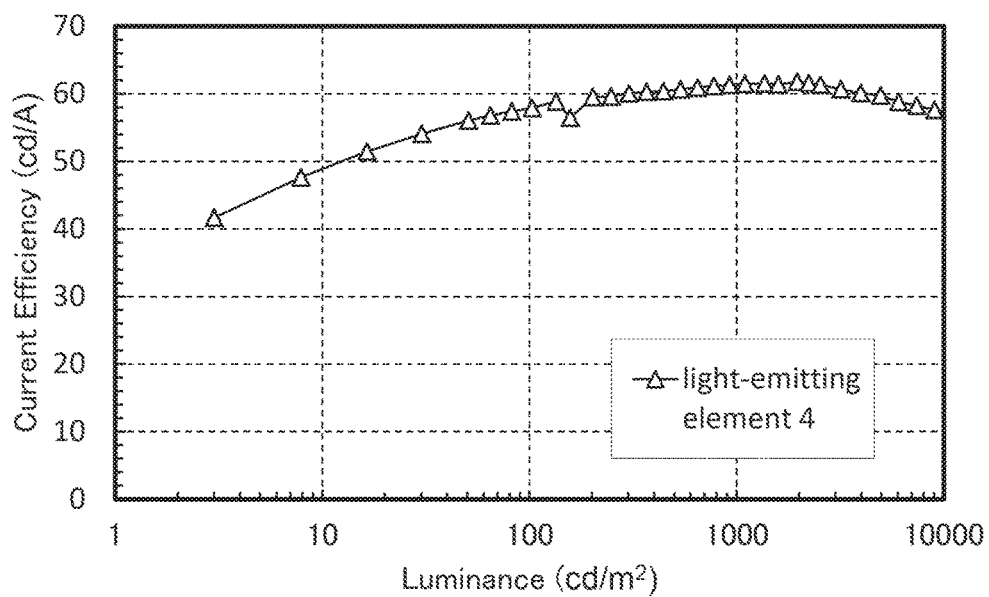
FIG. 11 shows luminance versus current efficiency characteristics of a light-emitting element 4.
Figure 12:
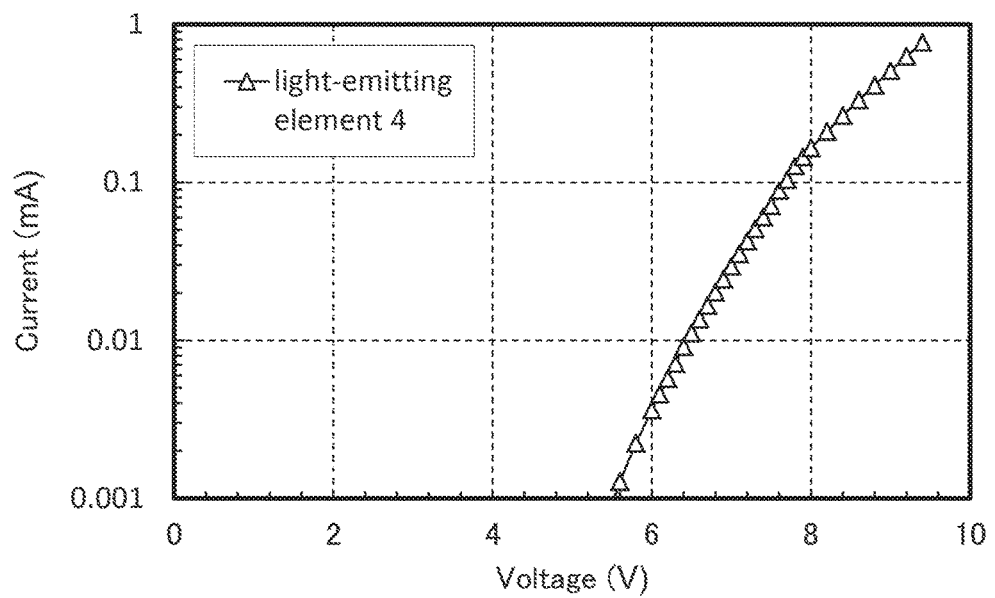
FIG. 12 shows voltage versus current characteristics of the light-emitting element 4.

FIG. 11 shows luminance versus current efficiency characteristics of the light-emitting element 4, and FIG. 12 shows voltage versus current characteristics thereof. In FIG. 11, the vertical axis represents current efficiency (cd/A) and the horizontal axis represents luminance (cd/m$^2$). In FIG. 12, the vertical axis represents current (mA) and the horizontal axis represents voltage (V).

The values of the main characteristics of the light-emitting element 4 are shown below. Note that the light-emitting element 4 emitted green light because the thickness of the ITSO layer of the cathode 101 affected a microcavity effect in the light-emitting element 4. The thickness of the ITSO layer was set on the assumption that the inverted-structure tandem light-emitting element was used for a green pixel in a display panel.

TABLE 6

| | Light-emitting element 4 |
|---|---|
| Voltage (V) | 7.4 |
| Current (mA) | 0.060 |
| Current density (mA/cm$^2$) | 1.51 |
| Chromaticity coordinates (x, y) | (0.35, 0.62) |
| Luminance (cd/m$^2$) | 925 |
| Current efficiency (cd/A) | 61 |
| Power efficiency (lm/W) | 26.0 |

As revealed from the results of the tests of the comparison light-emitting element 1 in Example 1, an inverted-structure tandem light-emitting element including an intermediate layer including an electron-injection buffer layer containing Li cannot function as a light-emitting element without the layer 103c in the intermediate layer. This example demonstrates that use of a layer containing Alq$_3$ (abbreviation) in the intermediate layer enables the light-emitting element 3 to function as a light-emitting element like the light-emitting element 1.

REFERENCE NUMERALS

100: substrate, 101: cathode, 102: first EL layer, 102a: electron-injection layer, 102b: electron-transport layer, 102c: light-emitting layer, 102d: hole-transport layer, 103: intermediate layer, 103a: charge generation layer, 103b: electron-relay layer, 103c: layer, 103d: electron-injection buffer layer, 104: second EL layer, 104a: electron-transport layer, 104b: light-emitting layer, 104c: hole-transport layer, 104d: hole-injection layer, 105: anode, 200: substrate, 201: cathode, 202(1): first EL layer, 202(2): second EL layer, 202(n-1): (n-1)th EL layer, 202(n): nth EL layer, 204: anode, 205(1): first intermediate layer, 205(2): second intermediate layer, 205(n-2): (n-2)th intermediate layer, 205(n-1): (n-1)th intermediate layer, 501: element substrate, 502: pixel portion, 503: driver circuit portion (source line driver circuit), 504a, 504b: driver circuit portion (gate line driver circuit), 505: sealant, 506: sealing substrate, 507: wiring, 508: FPC (flexible printed circuit), 509: n-channel FET, 510: p-channel FET, 511: switching FET, 512: current control FET, 513: cathode, 514: insulator, 515: first EL layer, 516: intermediate layer, 517: second EL layer, 518: anode, 519: light-emitting element, 520: space, 2001: first substrate, 2002: light-emitting portion, 2005a: first sealant, 2005b: second sealant, 2005c: first sealant, 2005d: second sealant, 2006: second substrate, 2011: second space, 2013: first space, 3100: light-emitting device, 3101: substrate, 3103a: lower electrode, 3103b: lower electrode, 3103c: lower electrode, 3105a: transparent conductive layer, 3105b: transparent conductive layer, 3107a: partition, 3107b: partition, 3107c: partition, 3107d: partition, 3110: first EL layer, 3112: charge generation layer, 3113: electron-relay layer, 3114: layer, 3116: electron-injection buffer layer, 3118: second EL layer, 3119: upper electrode, 3120*a*: light-emitting element, 3120*b*: light-emitting element, 3120*c*: light-emitting element, 4000: lighting device, 4001: lighting device, 4003: substrate, 4005: substrate, 4007: inverted-structure tandem light-emitting element, 4009: electrode, 4011: electrode, 4013: lower electrode, 4014: EL layer, 4015: upper electrode, 4017: auxiliary wiring, 4019: sealing substrate, 4021: sealant, 4023: desiccant, 4025: substrate, 4027: diffusing plate, 4100: lighting device, 4101: lighting device, 4103: sealing substrate, 4105: planarization film, 4107: inverted-structure tandem light-emitting element, 4109: electrode, 4111: electrode, 4113: lower electrode, 4114: EL layer, 4115: upper electrode, 4117: auxiliary wiring, 4121: sealant, 4125: substrate, 4127: diffusing plate, 4129: insulating layer, 4131: barrier film, 4500: touch sensor, 4510: conductive layer, 4510*a*: conductive layer, 4510*b*: conductive layer, 4510*c*: conductive layer, 4520: conductive layer, 4540: capacitor, 4710: conductive layer, 4810: insulating layer, 4820: insulating layer, 4910: substrate, 4920: substrate, 5000: module, 5001: upper cover, 5002: lower cover, 5003: FPC, 5004: touch panel, 5005: FPC, 5006: display panel, 5007: backlight unit, 5008: light source, 5009: frame, 5010: printed board, 5011: battery, 6001: substrate, 6002: light-emitting element, 6003: first electrode, 6004: EL layer, 6005: second electrode, 6006: buffer layer, 6007: third electrode, 6008: contact portion, 6100: light scattering layer, 6101: light scatterer, 6102: air layer, 6103: high refractive index layer, 6104: element layer, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: cellular phone, 7401: housing, 7402: display portion, 7403: operation button, 7404: external connection port, 7405: speaker, 7406: microphone, 8001: lighting device, 8002: lighting device, 8003: lighting device, 8004: lighting device, 9033: clasp, 9034: display mode switch, 9035: power switch, 9036: switch for switching to power-saving mode, 9038: operation switch, 9630: housing, 9631: display portion, 9631*a*: display portion, 9631*b*: display portion, 9632*a*: touch panel region, 9632*b*: touch panel region, 9633: solar cell, 9634: charge and discharge control circuit, 9635: battery, 9636: DCDC converter, 9637: operation key, 9638: converter, 9639: button.

This application is based on Japanese Patent Application serial no. 2014-021444 filed with the Japan Patent Office on Feb. 6, 2014, the entire contents of which are hereby incorporated by reference.

The invention claimed is:

1. A light-emitting element comprising:
   a cathode;
   a first EL layer over the cathode;
   a second EL layer over the first EL layer;
   an anode over the second EL layer; and
   an intermediate layer between the first EL layer and the second EL layer,
   wherein the intermediate layer comprises:
   a first layer comprising a hole-transport material and an electron acceptor;
   a second layer comprising an electron-transport material over the first layer; and
   a third layer comprising an alkali metal or an alkaline earth metal over the second layer.

2. The light-emitting element according to claim 1,
   wherein the first EL layer emits first light,
   wherein the second EL layer emits second light, and
   wherein a color of the first light and a color of the second light are different from each other.

3. The light-emitting element according to claim 1, wherein the second layer is configured to suppress diffusion of the alkali metal or the alkaline earth metal into the first layer.

4. The light-emitting element according to claim 1, wherein the third layer has a function as an electron injection buffer layer.

5. The light-emitting element according to claim 1, further comprising a layer between the first layer and the second layer, the layer comprising a phthalocyanine-based material or a metal complex having a metal-oxygen bond and an aromatic ligand.

6. The light-emitting element according to claim 1, wherein the cathode is electrically connected to a field effect transistor.

7. The light-emitting element according to claim 6, wherein the field effect transistor is an n-type field effect transistor.

8. The light-emitting element according to claim 6, wherein the field effect transistor comprises an oxide semiconductor in a semiconductor layer.

9. The light-emitting element according to claim 8, wherein the oxide semiconductor comprises indium, tin, and gallium.

10. The light-emitting element according to claim 1, wherein the electron-transport material comprises bathophenanthroline or tris(8-quinolinolato)aluminum.

11. The light-emitting element according to claim 1, wherein the alkali metal or the alkaline earth metal is lithium or calcium.

12. The light-emitting element according to claim 1, wherein the anode comprises oxygen, tin, and indium.

13. A lighting device comprising the light-emitting element according to claim 1.

14. An electronic appliance comprising the light-emitting element according to claim 1 and a color filter.

15. An electronic appliance comprising the light-emitting element according to claim 1 and a touch panel.

16. A light-emitting element comprising:
    a cathode;
    a plurality of EL layers over the cathode;
    an anode over the plurality of EL layers; and
    a plurality of intermediate layers, each intermediate layer being provided between two adjacent EL layers,
    wherein at least one of the plurality of intermediate layers comprises:
    a first layer comprising a hole-transport material and an electron acceptor;
    a second layer comprising an electron-transport material over the first layer; and
    a third layer comprising an alkali metal or an alkaline earth metal over the second layer.

17. The light-emitting element according to claim 16, further comprising a layer between the first layer and the second layer, the layer comprising a phthalocyanine-based material or a metal complex having a metal-oxygen bond and an aromatic ligand.

18. The light-emitting element according to claim 16, wherein the second layer is configured to suppress diffusion of the alkali metal or the alkaline earth metal into the first layer.

19. The light-emitting element according to claim 16, wherein the third layer has a function as an electron injection buffer layer.

20. The light-emitting element according to claim 16, wherein the cathode is electrically connected to a field effect transistor.

21. The light-emitting element according to claim 20, wherein the field effect transistor is an n-type field effect transistor.

22. The light-emitting element according to claim 20, wherein the field effect transistor comprises an oxide semiconductor in a semiconductor layer.

23. The light-emitting element according to claim 22, wherein the oxide semiconductor comprises indium, tin, and gallium.

24. The light-emitting element according to claim 16, wherein the electron-transport material comprises bathophenanthroline or tris(8-quinolinolato)aluminum.

25. The light-emitting element according to claim 16, wherein the alkali metal or the alkaline earth metal is lithium or calcium.

26. The light-emitting element according to claim 16, wherein the anode comprises oxygen, tin, and indium.

27. A lighting device comprising the light-emitting element according to claim 16.

28. An electronic appliance comprising the light-emitting element according to claim 16 and a color filter.

29. An electronic appliance comprising the light-emitting element according to claim 16 and a touch panel.

30. A light-emitting element comprising:
a cathode;
a first EL layer over the cathode;
a second EL layer over the first EL layer;
an anode over the second EL layer; and
an intermediate layer between the first EL layer and the second EL layer,
wherein the intermediate layer comprises:
a charge generation layer;
a layer comprising an electron-transport material over the charge generation layer; and
an electron-injection buffer layer over the layer comprising the electron- transport material.

31. The light-emitting element according to claim 30, wherein the intermediate layer further comprises an electron-relay layer between the charge generation layer and the layer comprising the electron-transport material.

32. The light-emitting element according to claim 31, wherein the electron-relay layer comprises a phthalocyanine-based material or a metal complex having a metal-oxygen bond and an aromatic ligand.

33. The light-emitting element according to claim 30, wherein the electron-transport material comprises bathophenanthroline or tris(8-quinolinolato)aluminum.

34. The light-emitting element according to claim 30, wherein the layer comprising the electron-transport material is configured to suppress diffusion of an alkali metal or an alkaline earth metal into the charge generation layer.

35. The light-emitting element according to claim 34, wherein the alkali metal or the alkaline earth metal is lithium or calcium.

36. The light-emitting element according to claim 30,
wherein the first EL layer emits first light,
wherein the second EL layer emits second light, and
wherein a color of the first light and a color of the second light are different from each other.

37. The light-emitting element according to claim 30, wherein the cathode is electrically connected to a field effect transistor.

38. The light-emitting element according to claim 37, wherein the field effect transistor is an n-type field effect transistor.

39. The light-emitting element according to claim 37, wherein the field effect transistor comprises an oxide semiconductor in a semiconductor layer.

40. The light-emitting element according to claim 39, wherein the oxide semiconductor comprises indium, tin, and gallium.

41. The light-emitting element according to claim 30, wherein the anode comprises oxygen, tin, and indium.

42. A lighting device comprising the light-emitting element according to claim 30.

43. An electronic appliance comprising the light-emitting element according to claim 30 and a color filter.

44. An electronic appliance comprising the light-emitting element according to claim 30 and a touch panel.

* * * * *